United States Patent
An et al.

(10) Patent No.: US 12,513,892 B2
(45) Date of Patent: Dec. 30, 2025

(54) CAPACITOR DEVICE HAVING A CHANGING GROUP 14 CONCERNTRATION IN THE LOWER ELECTRODE

(71) Applicant: Samsung Electronics Co., Ltd., Suwon-si (KR)

(72) Inventors: Jihoon An, Suwon-si (KR); Jin-Su Lee, Suwon-si (KR); Hongsik Chae, Suwon-si (KR); Donguk Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 557 days.

(21) Appl. No.: 17/968,464

(22) Filed: Oct. 18, 2022

(65) Prior Publication Data

US 2023/0337412 A1    Oct. 19, 2023

(30) Foreign Application Priority Data

Apr. 14, 2022   (KR) .................. 10-2022-0046210

(51) Int. Cl.
*H10B 12/00* (2023.01)

(52) U.S. Cl.
CPC ......... *H10B 12/315* (2023.02); *H10B 12/033* (2023.02)

(58) Field of Classification Search
CPC ............................ H10B 12/315; H10B 12/033
See application file for complete search history.

(56) References Cited

U.S. PATENT DOCUMENTS

| | | | |
|---|---|---|---|
| 7,235,482 B2 | 6/2007 | Wu et al. | |
| 9,159,608 B2 | 10/2015 | Park et al. | |
| 10,923,560 B2 | 2/2021 | Koyanagi et al. | |
| 2007/0131997 A1* | 6/2007 | Ohtsuka | H10D 1/696 257/301 |
| 2012/0149166 A1 | 6/2012 | Park et al. | |
| 2019/0267383 A1 | 8/2019 | Rocklein et al. | |
| 2019/0333985 A1* | 10/2019 | Lee | H10B 12/312 |
| 2021/0125996 A1* | 4/2021 | An | H10D 1/716 |

FOREIGN PATENT DOCUMENTS

| | | |
|---|---|---|
| CN | 1979870 A | 6/2007 |
| CN | 110164850 A | 8/2019 |
| KR | 2005/0002525 A | 1/2005 |

\* cited by examiner

*Primary Examiner* — Steven M Page
(74) *Attorney, Agent, or Firm* — Harness, Dickey & Pierce, P.L.C.

(57) ABSTRACT

A semiconductor device includes a substrate, a capacitor contact structure electrically connected to the substrate, and a lower electrode connected to the capacitor contact structure. The lower electrode includes a first electrode layer and a second electrode layer, the second electrode layer is on the first electrode layer, and the first electrode layer includes a group 14 element. The device includes a capacitor insulating layer covering the lower electrode, and an upper electrode covering the capacitor insulating layer. The first electrode layer includes an outer sidewall in contact with the capacitor insulating layer, the first electrode layer includes an inner sidewall in contact with the second electrode layer, and a concentration of the group 14 element in the inner sidewall of the first electrode layer is higher than a concentration of the group 14 element in the outer sidewall of the first electrode layer.

20 Claims, 24 Drawing Sheets

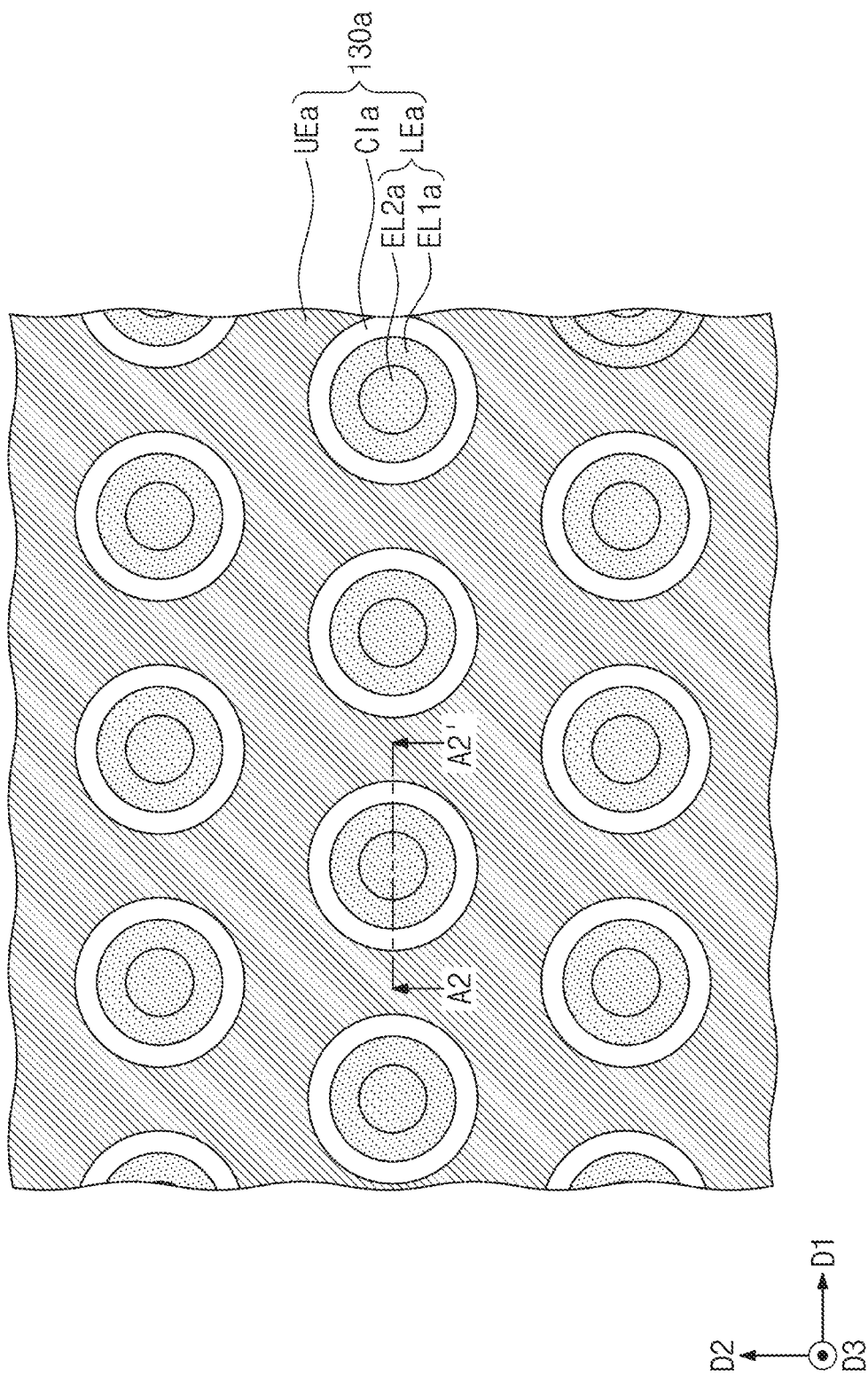

CAPACITOR DEVICE HAVING A CHANGING GROUP 14 CONCERNTRATION IN THE LOWER ELECTRODE

CROSS-REFERENCE TO RELATED APPLICATION

This U.S. non-provisional patent application claims priority under 35 U.S.C. § 119 to Korean Patent Application No. 10-2022-0046210, filed on Apr. 14, 2022, in the Korean Intellectual Property Office, the entire contents of which are hereby incorporated by reference.

FIELD

Some of the example embodiments relate to a semiconductor device and/or a method of fabricating the same, including a semiconductor device including a capacitor structure and/or a method of fabricating the same.

BACKGROUND

Due to their small-sized, multifunctional, and/or low-cost characteristics, semiconductor devices are being esteemed as important elements in the electronics industry. The semiconductor devices are classified into a semiconductor memory device for storing data, a semiconductor logic device for processing data, and a hybrid semiconductor device including both of memory and logic elements.

With the recent trend of high speed and low power consumption of electronic devices, semiconductor devices in the electronic devices are also desired or required to have high operating speeds and/or low operating voltages, and in order to satisfy this desire or requirement, it is desirable or necessary to increase an integration density of the semiconductor device. However, as the integration density of the semiconductor device increases, the semiconductor device may suffer from deterioration in electrical characteristics and production yield. Accordingly, many studies are being conducted to improve the electrical characteristics and production yield of the semiconductor device.

SUMMARY

An example embodiment of the inventive concepts provides a semiconductor device with improved reliability and electrical characteristics and a method of fabricating the same.

According to an example embodiment of the inventive concepts, a semiconductor device includes a substrate, a capacitor contact structure electrically connected to the substrate, and a lower electrode connected to the capacitor contact structure, wherein the lower electrode includes a first electrode layer and a second electrode layer, the second electrode layer is on the first electrode layer, and the first electrode layer includes a group 14 element. The device includes a capacitor insulating layer covering the lower electrode, and an upper electrode covering the capacitor insulating layer, wherein the first electrode layer comprises an outer sidewall in contact with the capacitor insulating layer, and the first electrode layer comprises an inner sidewall in contact with the second electrode layer, and a concentration of the group 14 element in the inner sidewall of the first electrode layer is higher than a concentration of the group 14 element in the outer sidewall of the first electrode layer.

According to an example embodiment of the inventive concepts, a semiconductor device includes a substrate, a capacitor contact structure electrically connected to the substrate, and a lower electrode connected to the capacitor contact structure, wherein the lower electrode comprises a first electrode layer and a second electrode layer, the second electrode layer is on the first electrode layer, the first electrode layer encloses at least a portion of the second electrode layer, the first electrode layer includes a group 14 element, and a concentration of the group 14 element in the first electrode layer increases as a distance to the second electrode layer decreases. The device includes a capacitor insulating layer covering the lower electrode, and an upper electrode covering the capacitor insulating layer.

According to an example embodiment of the inventive concepts, a semiconductor device includes a substrate including an active pattern, a capacitor contact structure electrically connected to the active pattern, and a lower electrode connected to the capacitor contact structure, wherein the lower electrode comprises a first electrode layer and a second electrode layer, the first electrode layer is connected to the capacitor contact structure, the second electrode layer is on the first electrode layer, the first electrode layer encloses at least a portion of the second electrode layer, the first electrode layer comprises TiSiN. The device includes a supporter configured to support the lower electrode, a capacitor insulating layer enclosing the supporter and the lower electrode, and an upper electrode enclosing the capacitor insulating layer, wherein the first electrode layer comprises an outer sidewall in contact with the capacitor insulating layer, an inner sidewall in contact with the second electrode layer, and a bottom surface in contact with the capacitor contact structure, and a concentration of a silicon in the inner sidewall of the first electrode layer is higher than a concentration of a silicon in the outer sidewall of the first electrode layer and a concentration of a silicon in the bottom surface of the first electrode layer.

According to an example embodiment of the inventive concepts, a method of fabricating a semiconductor device, including forming a capacitor contact structure electrically connected to a substrate, forming sacrificial layers and supporters on the capacitor contact structure, patterning the sacrificial layers and the supporters to form a first space exposing the capacitor contact structure, and forming a lower electrode in the first space, wherein forming the lower electrode includes forming a first preliminary electrode layer to fill a portion of the first space and to define a second space enclosed by the first preliminary electrode layer, injecting a group 14 element into the first preliminary electrode layer through a surface of the first preliminary electrode layer exposed through the second space, removing an upper portion of the first preliminary electrode layer to form a first electrode layer, and forming a second electrode layer on the first electrode layer. The method includes forming a capacitor insulating layer to cover the lower electrode, and forming an upper electrode to cover the capacitor insulating layer.

BRIEF DESCRIPTION OF THE DRAWINGS

FIG. 3A is a plan view illustrating a semiconductor device according to an example embodiment of the inventive concepts.

DETAILED DESCRIPTION

Example embodiments of the inventive concepts will now be described more fully with reference to the accompanying drawings, in which example embodiments are shown.

Figure 1A:
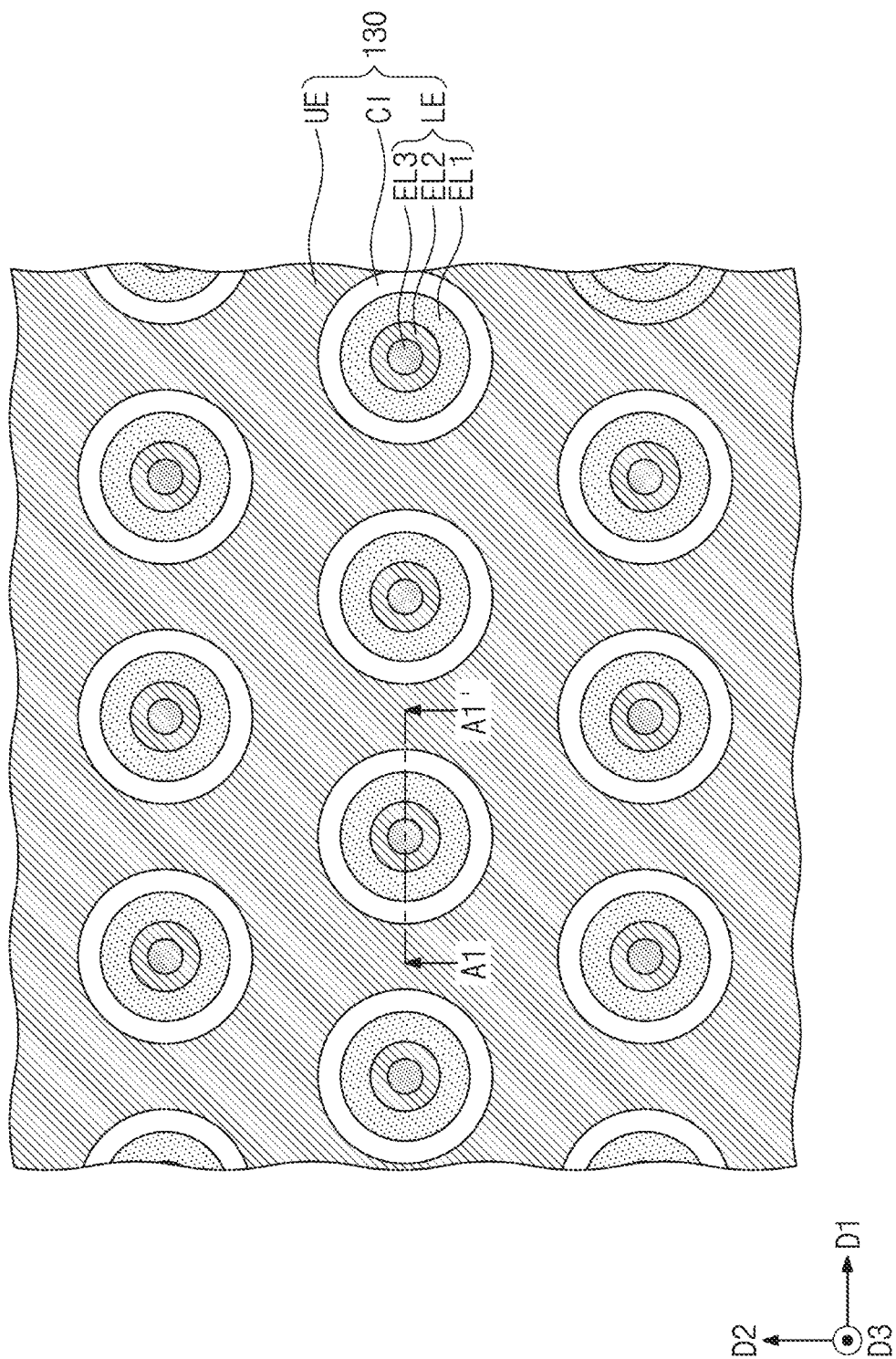
FIG. 1A is a plan view illustrating a semiconductor device according to an example embodiment of the inventive concepts.
Figure 1B:
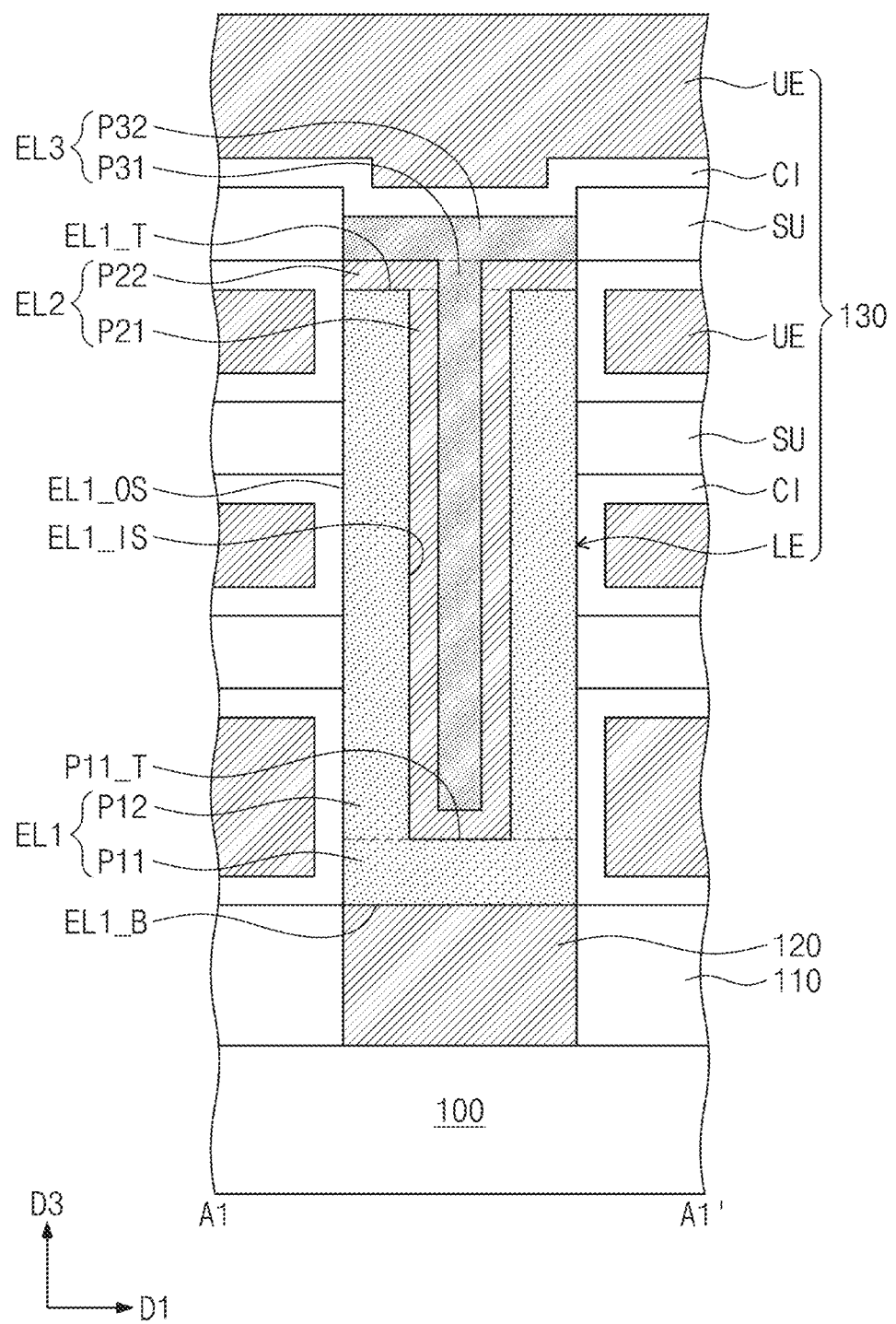
FIG. 1B is a sectional view taken along a line A1-A1' of FIG. 1A.

FIG. 1A is a plan view illustrating a semiconductor device according to an example embodiment of the inventive concepts. FIG. 1B is a sectional view taken along a line A1-A1' of FIG. 1A.

Referring to FIGS. 1A and 1B, a semiconductor device may include a substrate 100. In an example embodiment, the substrate 100 may be a semiconductor substrate. As an example, the substrate 100 may be formed of or include silicon, germanium, silicon-germanium, GaP, or GaAs. In an example embodiment, the substrate 100 may be a silicon-on-insulator (SOI) substrate or a germanium-on-insulator (GOI) substrate. The substrate 100 may have a shape of a plate, which is extended in a first direction D1 and a second direction D2. The first and second directions D1 and D2 may not be parallel to each other. In an example embodiment, the first and second directions D1 and D2 may be horizontal directions, which are orthogonal to each other.

An interlayer insulating layer 110 may be provided to cover the substrate 100. In an example embodiment, the interlayer insulating layer 110 may have a multi-layered insulating structure including a plurality of insulating layers.

Capacitor contact structures 120 may be provided in the interlayer insulating layer 110. The capacitor contact structure 120 may be electrically connected to the substrate 100. In an example embodiment, the capacitor contact structure 120 may be connected to an impurity region formed in the substrate 100. In an example embodiment, the capacitor contact structure 120 may have a multi-layered conductive structure including a plurality of conductive layers.

A capacitor structure 130 may be provided on the interlayer insulating layer 110 and the capacitor contact structure 120. The capacitor structure 130 may be electrically connected to the capacitor contact structure 120. The capacitor structure 130 may be electrically connected to the substrate 100 through the capacitor contact structure 120. The capacitor structure 130 may include lower electrodes LE, a capacitor insulating layer CI, supporters SU, and an upper electrode UE.

The lower electrode LE may have a shape of a circular pillar extending in a third direction D3. The third direction D3 may not be parallel to the first and second directions D1 and D2. As an example, the third direction D3 may be a vertical direction orthogonal to the first and second directions D1 and D2. The lower electrode LE may be connected to the capacitor contact structure 120. The supporters SU may be provided to support the lower electrodes LE. The supporter SU may have a side surface that is in contact with a side surface of the lower electrode LE, and thus, the supporter SU may be used to support the side surface of the lower electrode LE. The supporter SU may be formed of or include an insulating material. As an example, the supporter SU may be formed of or include nitride.

The capacitor insulating layer CI may cover the lower electrodes LE and the supporters SU. The capacitor insulating layer CI may be provided to enclose the lower electrodes LE and the supporters SU. The capacitor insulating layer CI may cover the interlayer insulating layer 110. The capacitor insulating layer CI may include a portion provided between the lower electrode LE and the upper electrode UE, a portion provided between the upper electrode UE and the supporter SU, and a portion provided between the interlayer insulating layer 110 and the upper electrode UE. The capacitor insulating layer CI may be formed of or include an insulating material. As an example, the capacitor insulating layer CI may be formed of or include oxide. In an example embodiment, the capacitor insulating layer CI may be a multi-layered insulating layer.

The upper electrode UE may cover the capacitor insulating layer CI. The upper electrode UE may be provided to enclose the lower electrodes LE, the supporters SU, and the capacitor insulating layer CI. The upper electrode UE may be formed of or include a conductive material. As an example, the upper electrode UE may be formed of or include TiN. In an example embodiment, the upper electrode UE may be a crystalline layer. As an example, the upper electrode UE may be a crystalline TiN layer.

The lower electrode LE may include a first electrode layer EL1 a second electrode layer EL2 on the first electrode layer EL1 and a third electrode layer EL3 on the second electrode layer EL2. The first electrode layer EL1 may be provided to enclose at least a portion of the second electrode layer EL2. The second electrode layer EL2 may be provided to enclose at least a portion of the third electrode layer EL3.

The first electrode layer EL1 may include a first portion P11 and a second portion P12. The first portion P11 of the first electrode layer EL1 may be connected to the capacitor contact structure 120. The second portion P12 of the first electrode layer EL1 may be provided on the first portion P11 of the first electrode layer EL1 The second portion P12 of the first electrode layer EL1 may be provided to enclose the second electrode layer EL2. The second portion P12 of the first electrode layer EL1 may be a pipe-shaped pattern that is extended in the third direction D3. The first portion P11 of the first electrode layer EL1 may be disposed at a level lower than the second electrode layer EL2. The first portion P11 of the first electrode layer EL1 may have a shape of a circular plate, which is extended in the first and second directions D1 and D2.

An outer sidewall EL1_OS of the first electrode layer EL1 may be in contact with the supporters SU and the capacitor insulating layer CI. An inner sidewall EL1IS of the first electrode layer EL1 may be in contact with the second electrode layer EL2. The outer sidewall EL1_OS of the first electrode layer EL1 may be provided to enclose the inner sidewall EL1IS of the first electrode layer EL1. A top surface P11_T of the first portion P11 of the first electrode layer EL1 may be connected to the lowermost portion of the inner sidewall EL1IS of the first electrode layer EL1. The top surface P11_T of the first portion P11 of the first electrode layer EL1 may be in contact with a bottom surface of the second electrode layer EL2.

The second electrode layer EL2 may include a first portion P21 and a second portion P22. The first portion P21 of the second electrode layer EL2 may be provided on the first portion P11 of the first electrode layer EL1. The second portion P22 of the second electrode layer EL2 may be provided on the first portion P21 of the second electrode layer EL2. The first portion P21 of the second electrode layer EL2 may be a portion, which is enclosed by the second portion P12 of the first electrode layer EL1. The first portion P21 of the second electrode layer EL2 may be provided in the first electrode layer EL1. The second portion P22 of the second electrode layer EL2 may be disposed at a level higher than the first electrode layer EL1. The first portion P21 of the second electrode layer EL2 may be in contact with the inner sidewall EL1IS of the first electrode layer EL1. The second portion P22 of the second electrode layer EL2 may be in contact with a top surface EL1_T of the first electrode layer EL1. The top surface EL1_T of the first electrode layer EL1 may be a top surface of the second portion P12 of the first electrode layer EL1. An outer sidewall of the second portion P22 of the second electrode layer EL2 may be in contact with the capacitor insulating layer CI. The second portion P22 of the second electrode layer EL2 may have a ring shape.

The third electrode layer EL3 may include a first portion P31 and a second portion P32. The second portion P32 of the third electrode layer EL3 may be provided on the first portion P31 of the third electrode layer EL3. The first portion P31 of the third electrode layer EL3 may be a portion enclosed by the second electrode layer EL2. A first portion EL31 of the third electrode layer EL3 may be provided in the second electrode layer EL2. The first portion P31 of the third electrode layer EL3 may have a circular pillar shape extending in the third direction D3. The first portion P31 of the third electrode layer EL3 may be provided to penetrate the second portion P22 of the second electrode layer EL2. The second portion P32 of the third electrode layer EL3 may be disposed at a level higher than the second electrode layer EL2. An outer sidewall of the second portion P32 of the third electrode layer EL3 may be in contact with the supporter SU. The second portion P32 of the third electrode layer EL3 may have a shape of a circular plate, which is extended in the first and second directions D1 and D2. A width of the second portion P32 of the third electrode layer EL3 may be larger than a width of the first portion P31 of the third electrode layer EL3.

The first electrode layer EL1 may be formed of or include a conductive material containing a group 14 element. In an example embodiment, the group 14 element may be silicon (Si) or carbon (C), and the first electrode layer EL1 may be formed of or include TiSiN or TiCN. In an example embodiment, an atomic size of the group 14 element, which is contained in the first electrode layer EL1 may be smaller than an atomic size of titanium (Ti).

A concentration of the group 14 element in the first electrode layer EL1 may not be uniform. The concentration of the group 14 element in the first electrode layer EL1 may increase as a distance to the top surface EL1_T of the first electrode layer EL1, the inner sidewall EL1IS of the first electrode layer EL1, or the top surface P1 LT of the first portion P11 of the first electrode layer EL1 decreases. The concentration of the group 14 element in the first electrode layer EL1 may increase as a distance to the second electrode layer EL2 decreases.

The concentration of the group 14 element in the inner sidewall EL1IS of the first electrode layer EL1 may be higher than the concentration of the group 14 element in the bottom surface EL1_B of the first electrode layer EL1. The bottom surface EL1_B of the first electrode layer EL1 may be a bottom surface of the first portion P11 of the first electrode layer EL1. The bottom surface EL1_B of the first electrode layer EL1 may be in contact with a top surface of the capacitor contact structure 120. The concentration of the group 14 element in the inner sidewall EL1IS of the first electrode layer EL1 may be higher than the concentration of the group 14 element in the outer sidewall EL1_OS of the first electrode layer EL1. The concentration of the group 14 element in the first electrode layer EL1 may increase in a direction from the outer sidewall EL1 OS toward the inner sidewall EL1IS. The concentration of the group 14 element in the top surface P1 LT of the first portion P11 of the first electrode layer EL1 may be higher than the concentration of the group 14 element in the bottom surface EL1_B of the first electrode layer EL1. The concentration of the group 14 element in the first electrode layer EL1 may increase in a direction from the bottom surface EL1_B toward the top surface P1 LT of the first portion P11. In an embodiment, the concentration of the group 14 element in the first electrode layer EL1 may be lower than a titanium concentration and a nitrogen concentration in the first electrode layer EL1.

The second electrode layer EL2 may be formed of or include a conductive material, in which a group 14 element is not contained. In an example embodiment, the second electrode layer EL2 may be formed of or include TiN. The third electrode layer EL3 may contain the same or substantially the same elements as the first electrode layer EL1. The third electrode layer EL3 may be formed of or include a conductive material containing a group 14 element. As an example, the third electrode layer EL3 may be formed of or include TiSiN or TiCN. The first and third electrode layers EL1 and EL3 may have crystal structures different from each other. A mean size of grains in the first electrode layer EL1 and a mean size of grains in the second electrode layer EL2 may be larger than a mean size of grains in the third electrode layer EL3.

In an example embodiment, each of the first and second electrode layers EL1 and EL2 may be a crystalline layer, and the third electrode layer EL3 may be an amorphous layer. As an example, the first electrode layer EL1 may be a crystalline TiSiN layer, the second electrode layer EL2 may be a crystalline TiN layer, and the third electrode layer EL3 may be an amorphous TiSiN layer. In an example embodiment, the first and third electrode layers EL1 and EL3 may include grains different from each other. As an example, the first electrode layer EL1 may contain TiN grain and TiSiN grain, and the third electrode layer EL3 may contain TiN grain, TiSiN grain, and SiN grain.

In the semiconductor device according to an example embodiment of the inventive concepts, since the first electrode layer EL1 contains the group 14 element, a mechanical strength or hardness of the lower electrode LE may be improved. Owing to the improvement of the mechanical strength of the lower electrode LE, it may be possible to prevent or suppress a warpage issue in the lower electrode LE and to prevent or suppress the lower electrodes LE from being electrically connected to each other.

In the semiconductor device according to an example embodiment of the inventive concepts, the concentration of the group 14 element may be relatively low in the outer sidewall EL1_OS of the first electrode layer ELL Accordingly, it may be possible to prevent or suppress dielectric characteristics of the capacitor insulating layer CI from being deteriorated by the group 14 element contained in the first electrode layer ELL In the semiconductor device according to an example embodiment of the inventive concepts, the first electrode layer EL1 may be a crystalline layer. Accordingly, it may be possible to prevent or suppress crystalline characteristics of the capacitor insulating layer CI in contact with the first electrode layer EL1 from being deteriorated.

Figure 1C:
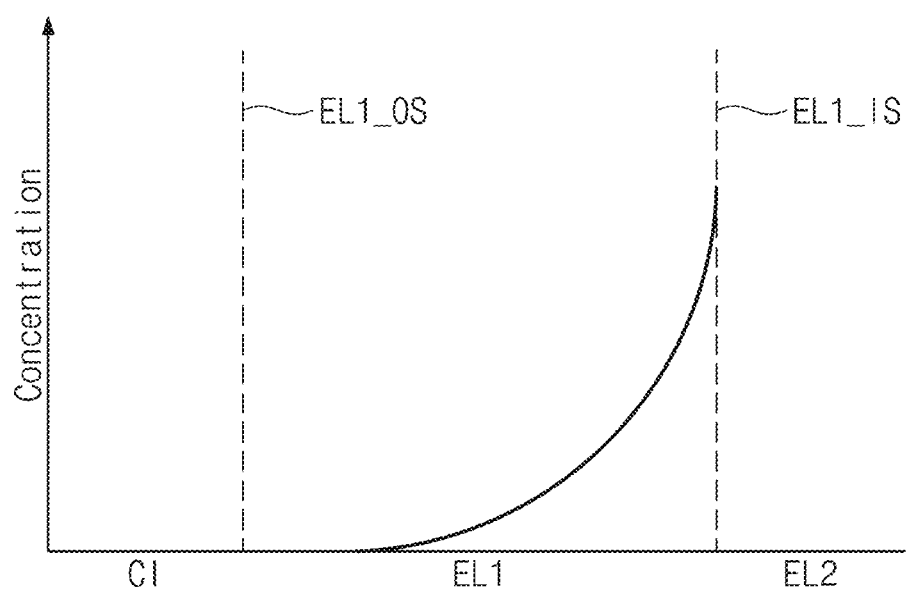
FIG. 1C is a graph showing an example of a concentration of a group 14 element in a first electrode layer of the semiconductor device according to FIGS. 1A and 1B.

FIG. 1C is a graph showing an example of a concentration of a group 14 element in a first electrode layer of the semiconductor device according to FIGS. 1A and 1B.

As shown in the example of FIG. 1C, a concentration of the group 14 element contained in the first electrode layer EL1 may increase as a distance to the inner sidewall EL1IS of the first electrode layer EL1 decreases.

FIGS. 2A, 2B, 2C, 2D, 2E, 2F, 2G, and 2H are sectional views illustrating a method of fabricating the semiconductor device of FIGS. 1A and 1B.

Figure 2A:
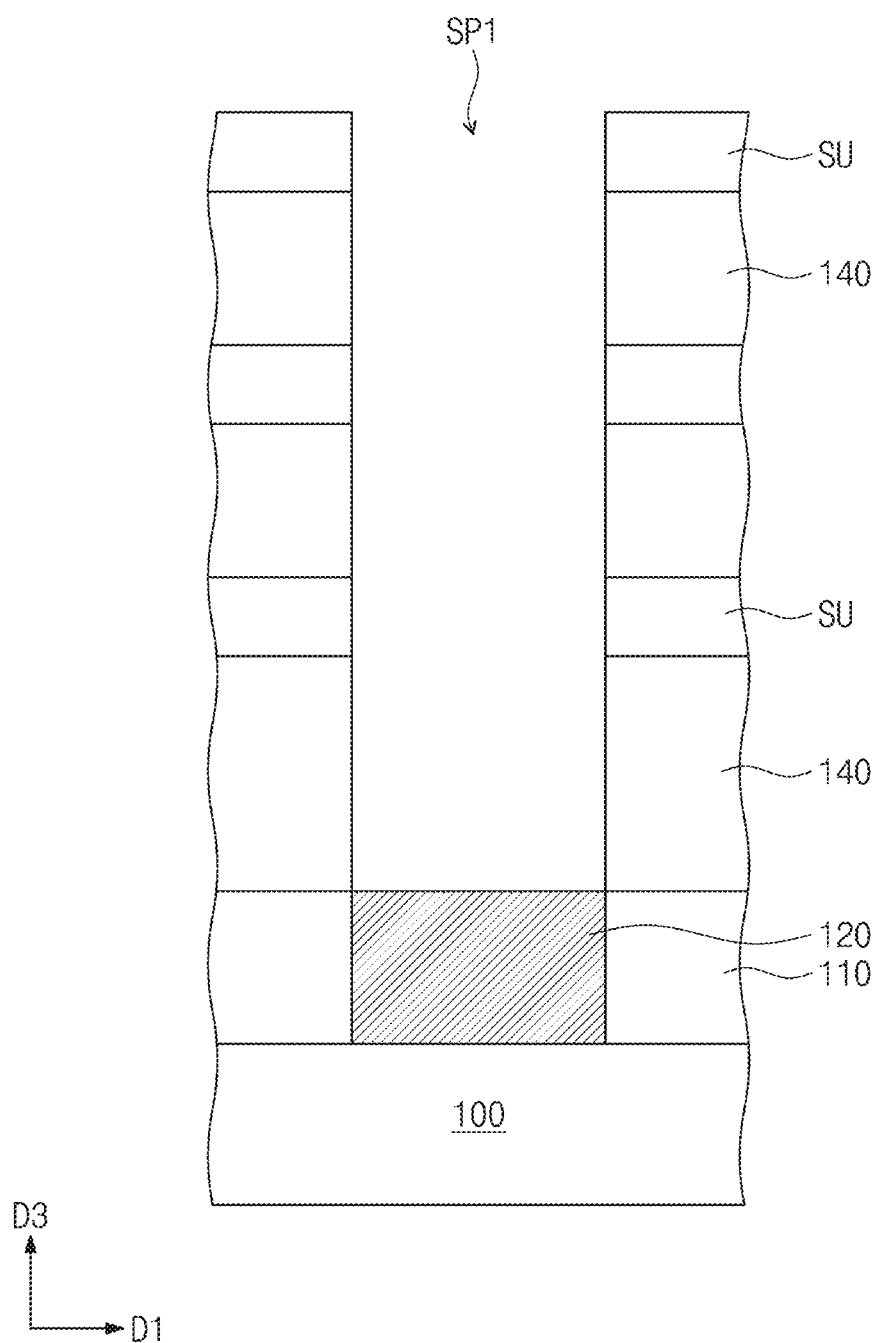
FIGS. 2A, 2B, 2C, 2D, 2E, 2F, 2G, and 2H are sectional views illustrating a method of fabricating the semiconductor device of FIGS. 1A and 1B.

Referring to FIG. 2A, the interlayer insulating layer 110 and the capacitor contact structure 120 may be formed on the substrate 100. Sacrificial layers 140 and the supporters SU may be alternately formed on the interlayer insulating layer 110 and the capacitor contact structure 120. The sacrificial layer 140 and the supporter SU may be formed of or include different insulating materials from each other. The insulating material of the sacrificial layer 140 may be chosen to have an etch selectivity with respect to the insulating material of the supporter SU. For example, the sacrificial layer 140 may be formed of or include oxide, and the supporter SU may be formed of or include nitride.

The sacrificial layers 140 and the supporters SU may be patterned to form a first space SP1. The first space SP1 may be formed to penetrate the sacrificial layers 140 and the supporters SU in the third direction D3 or to have a shape of a circular pillar. The first space SP1 may be formed to expose the capacitor contact structure 120. The first space SP1 may be an empty space enclosed by the sacrificial layers 140 and the supporters SU.

Figure 2B:
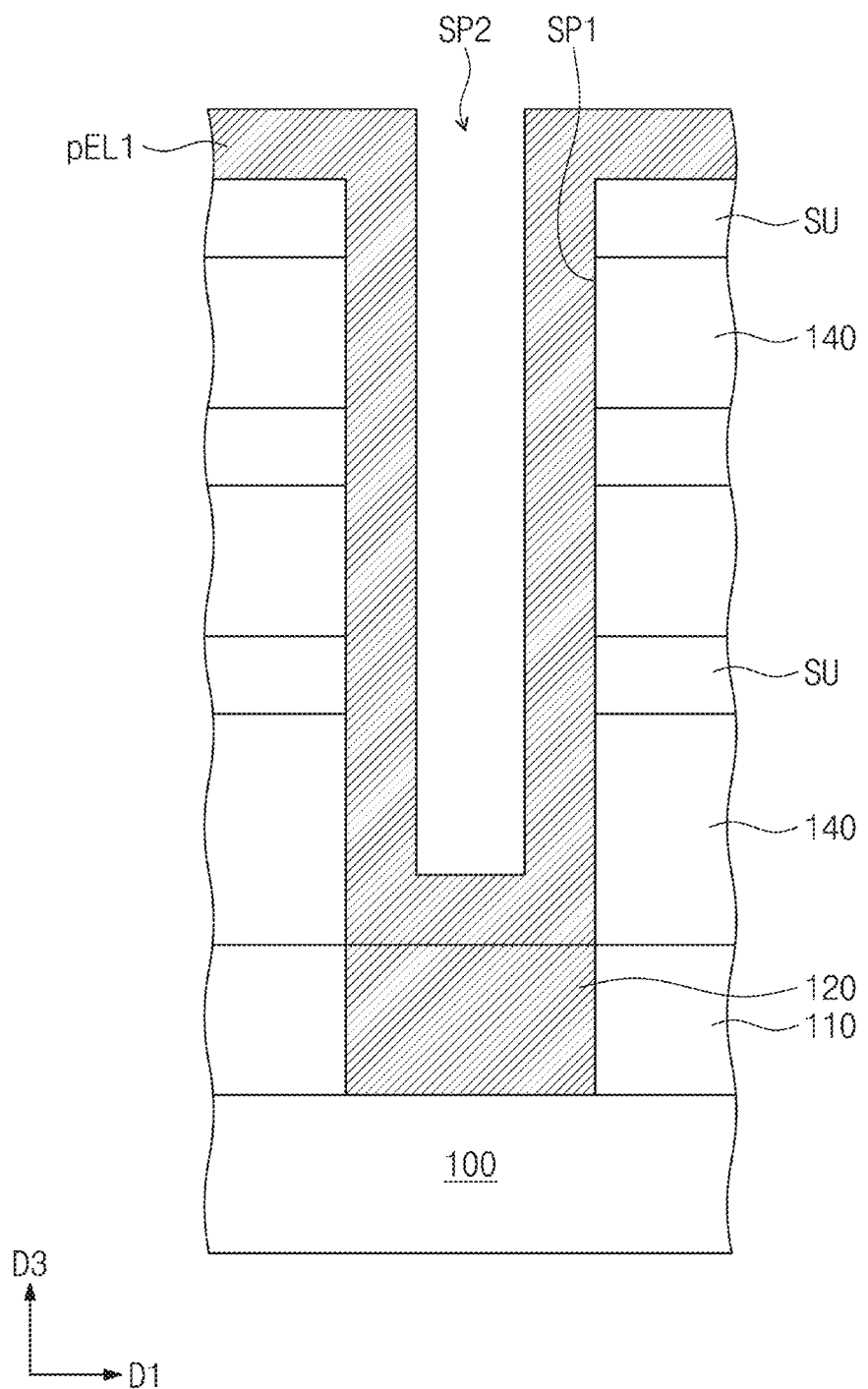

Referring to FIG. 2B, a first preliminary electrode layer pEL1 may be formed to cover the sacrificial layers 140, the supporters SU, and the capacitor contact structure 120. The first preliminary electrode layer pEL1 may be formed to fill a portion of the first space SP1. The first preliminary electrode layer pEL1 may be conformally formed. The first preliminary electrode layer pEL1 may be formed of or include a conductive material. As an example, the first preliminary electrode layer pEL1 may be formed of or include TiN. In an example embodiment, the first preliminary electrode layer pEL1 may be a crystalline layer. As an example, the first preliminary electrode layer pEL1 may be a crystalline TiN layer. The first preliminary electrode layer pEL1 may be formed by, for example, an atomic layer deposition (ALD) process.

A second space SP2 may be defined by the first preliminary electrode layer pEL1. The second space SP2 may be an empty space that is enclosed by the first preliminary electrode layer pEL1. The second space SP2 may include a portion of the first space SP1, which is not filled with the first preliminary electrode layer pEL1. A lower portion of the second space SP2 may be enclosed by the sacrificial layers 140 and the supporters SU.

Figure 2C:
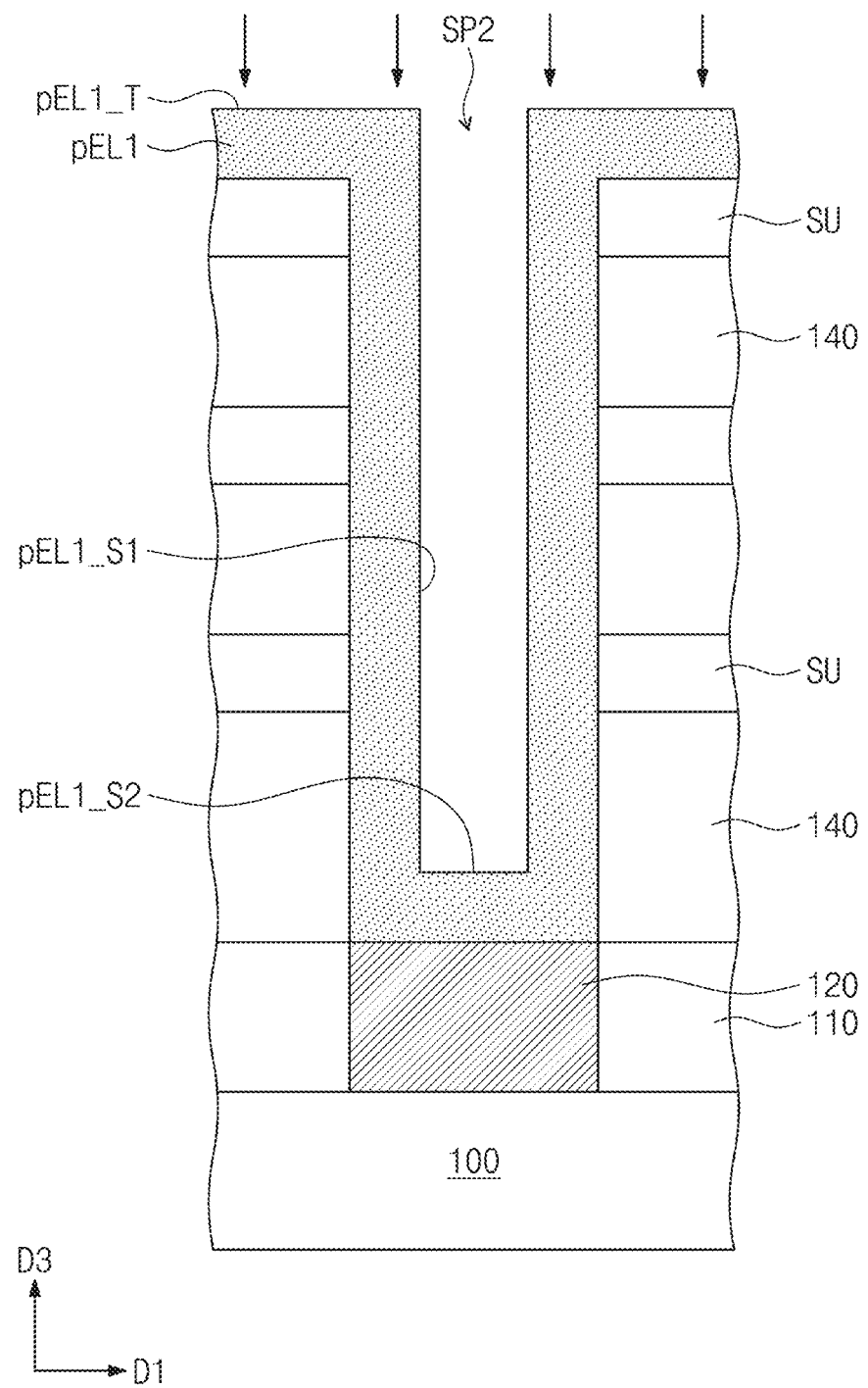

Referring to FIG. 2C, a group 14 element may be injected into the first preliminary electrode layer pEL1. As an example, the group 14 element may be diffused into the first preliminary electrode layer pEL1. In an example embodiment, the injection of the group 14 element may be performed through an atomic layer deposition (ALD) or chemical vapor deposition (CVD) process using a group-14-element-containing precursor. For example, the group 14 element may be silicon, and a precursor, which is used in the ALD or CVD process, may be at least one of $SiCl_2H_2$, $SiCl_4$, and $SiH_4$. In an example embodiment, the injection of the group 14 element may be performed through an implantation process.

The group 14 element may be injected into the first preliminary electrode layer pEL1 through exposed surfaces of the first preliminary electrode layer pEL1. The group 14 element may be injected into the first preliminary electrode layer pEL1 through a top surface pEL1_T, a first surface pEL1_S1, and a second surface pEL1_S2 of the first preliminary electrode layer pEL1. The first surface pEL1_S1 and the second surface pEL1_S2 of the first preliminary electrode layer pEL1 may be exposed through the second space SP2. The first surface pEL1_S1 of the first preliminary electrode layer pEL1 may be a surface defining a side surface of the second space SP2, and the second surface pEL1_S2 of the first preliminary electrode layer pEL1 may be a surface defining a bottom surface of the second space SP2.

The concentration of the group 14 element in the first preliminary electrode layer pEL1 may not be uniform. The concentration of the group 14 element may increase as a distance to the top surface pEL1_T, the first surface pEL1_S1, and the second surface pEL1_S2 of the first preliminary electrode layer pEL1 decreases. A concentration gradient of the group 14 element in the first preliminary electrode layer pEL1 may vary depending on an injection depth of the group 14 element. In an example embodiment, the first preliminary electrode layer pEL1, in which the group 14 element is injected, may be a crystalline layer. As an example, the first preliminary electrode layer pEL1, in which the group 14 element is injected, may be a crystalline TiSiN layer. In an example embodiment, the group 14 element may be injected into the first preliminary electrode layer pEL1 by replacing a titanium in the first preliminary electrode layer pEL1 with the group 14 element.

Figure 2D:
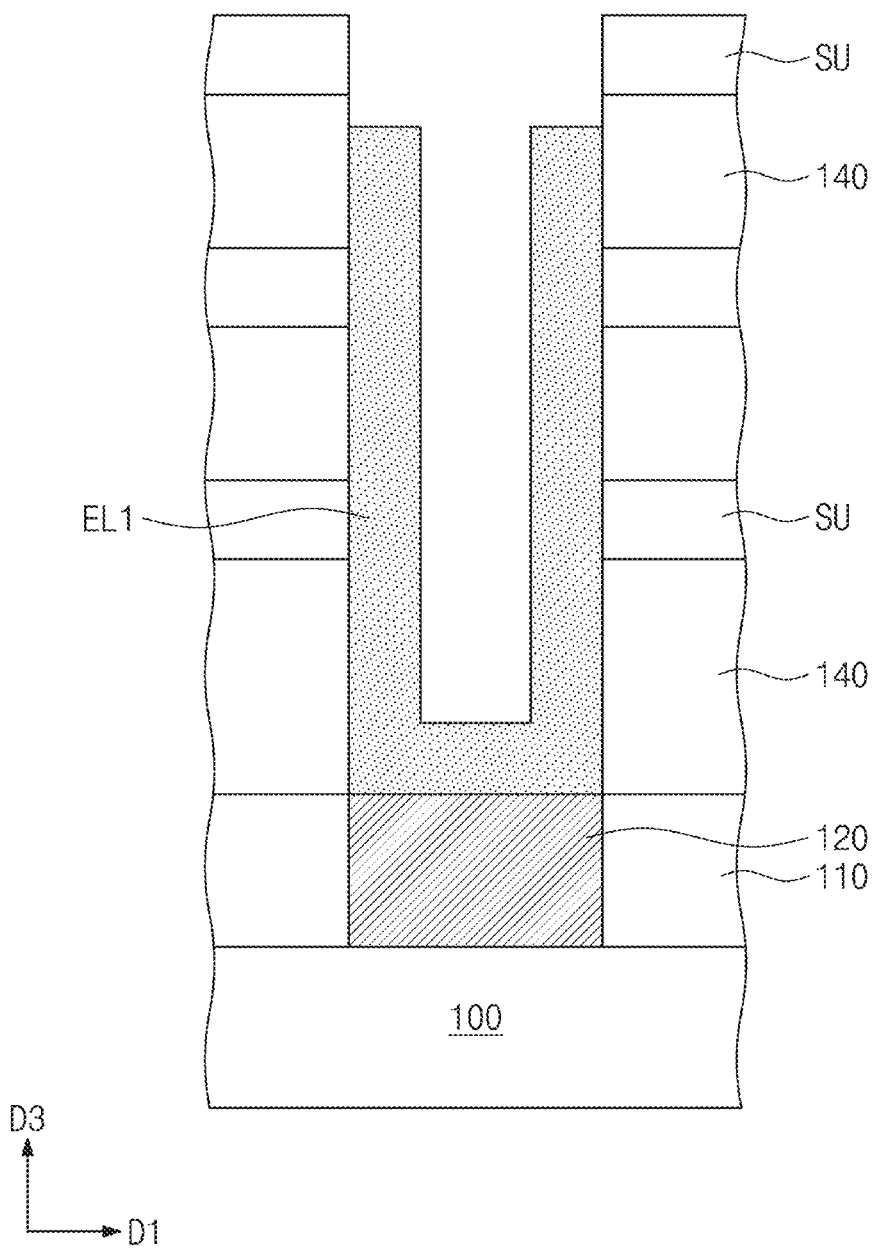

Referring to FIG. 2D, the first electrode layer EL1 may be formed by removing an upper portion of the first preliminary electrode layer pEL1. In an example embodiment, the first preliminary electrode layer pEL1 may be divided into a plurality of first electrode layers EL1.

Figure 2E:
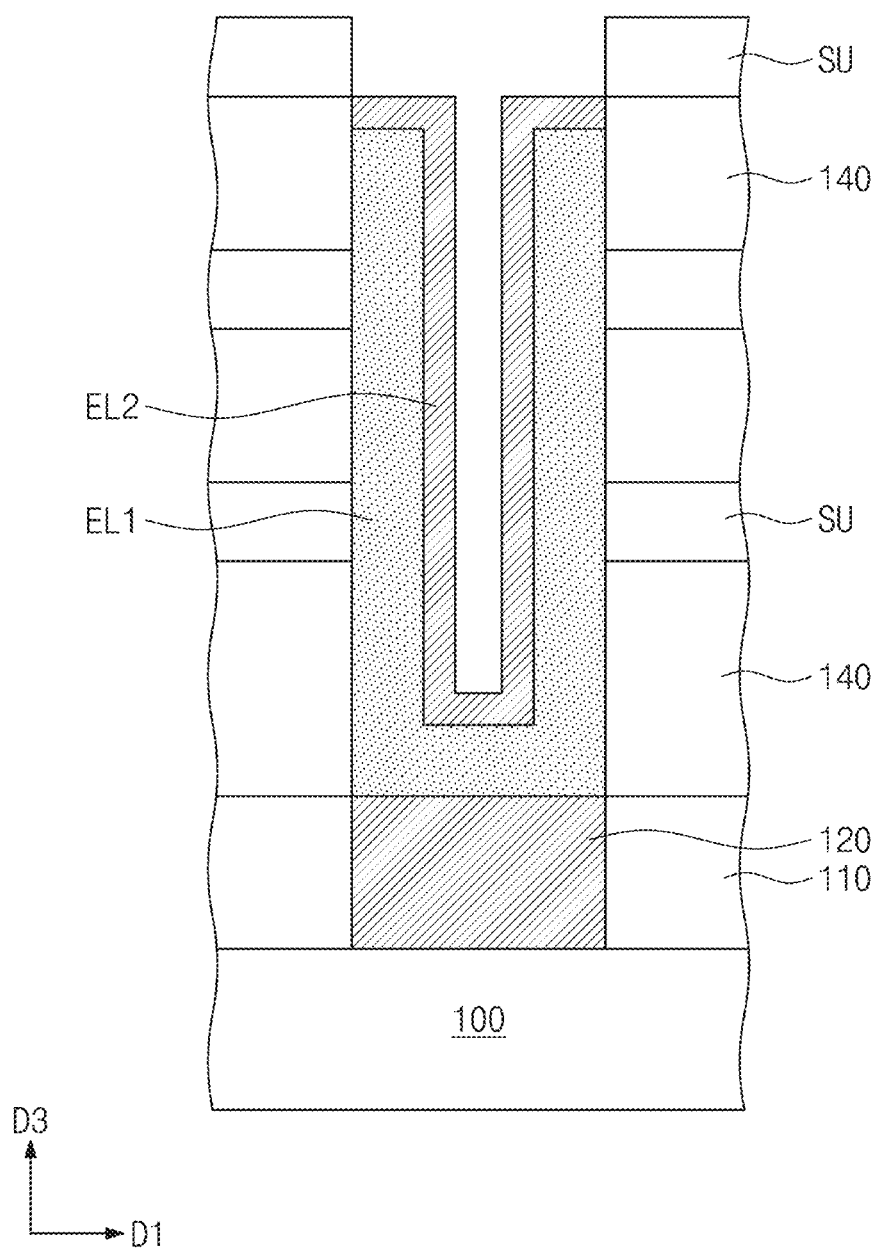

Referring to FIG. 2E, the second electrode layer EL2 may be formed on the first electrode layer ELL The formation of the second electrode layer EL2 may include forming a second preliminary electrode layer to conformally cover the first electrode layer EL1 and removing an upper portion of the second preliminary electrode layer to form the second electrode layer EL2. The second preliminary electrode layer may be formed of or include a conductive material, in which a group 14 element is not contained. As an example, the second preliminary electrode layer may be formed of or include TiN. In an example embodiment, the second preliminary electrode layer may be a crystalline layer. As an example, the second preliminary electrode layer may be a crystalline TiN layer.

Figure 2F:
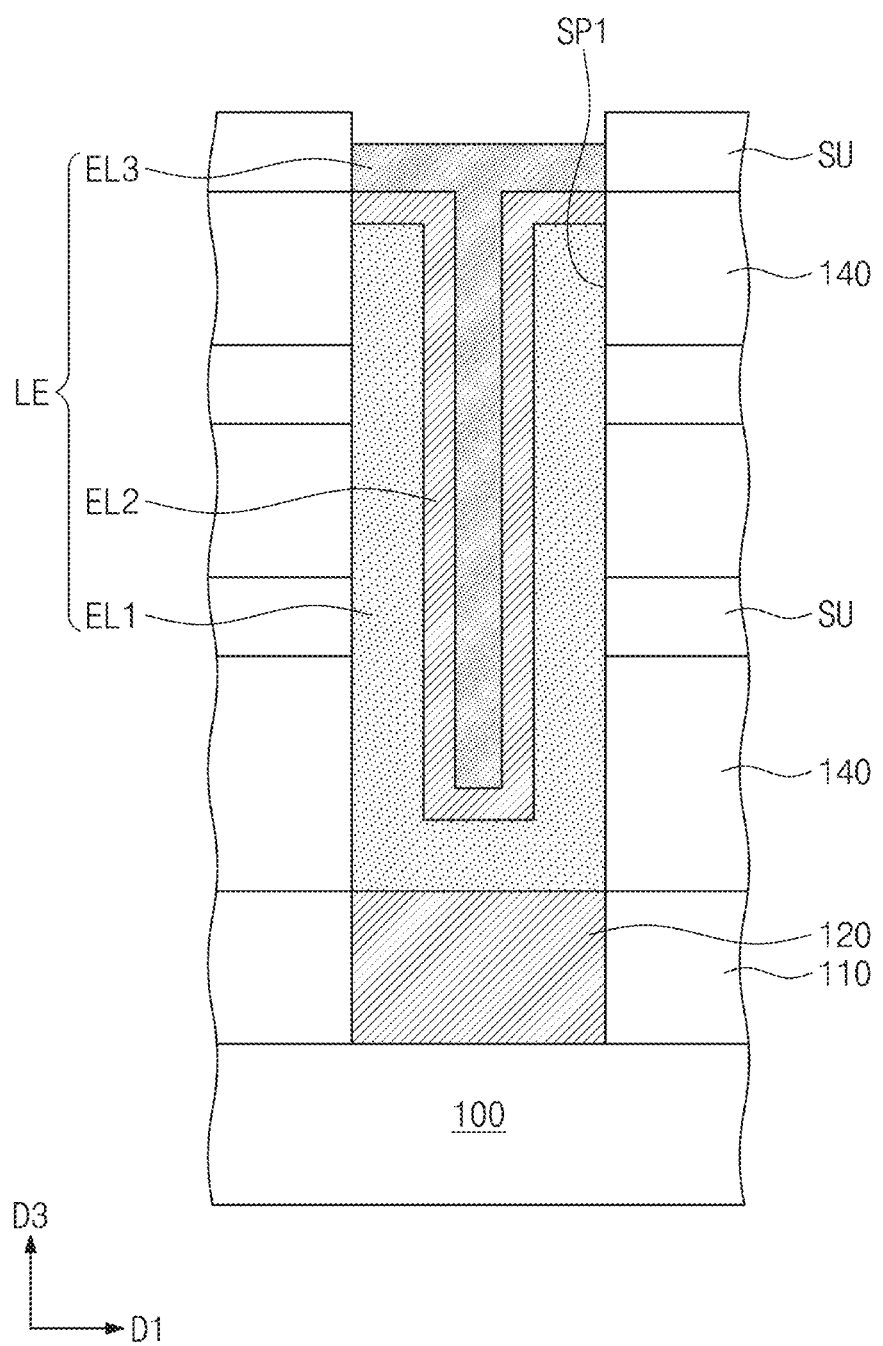

Referring to FIG. 2F, the third electrode layer EL3 may be formed on the second electrode layer EL2. The formation of the third electrode layer EL3 may include forming a third preliminary electrode layer to conformally cover the second electrode layer EL2 and removing an upper portion of the third preliminary electrode layer to form the third electrode layer EL3.

The third preliminary electrode layer may be formed of or include a conductive material containing a group 14 element. As an example, the third preliminary electrode layer may be formed of or include TiSiN. In an example embodiment, the third preliminary electrode layer may be an amorphous layer. As an example, the third preliminary electrode layer may be an amorphous TiSiN layer. In an example embodiment, the third preliminary electrode layer may be formed by alternately forming TiN layers and SiN layers. As a result of the formation of the third electrode layer EL3, the lower electrode LE including the first, second, and third electrode layers EL1, EL2, and EL3 may be formed in the first space SP1.

Figure 2G:
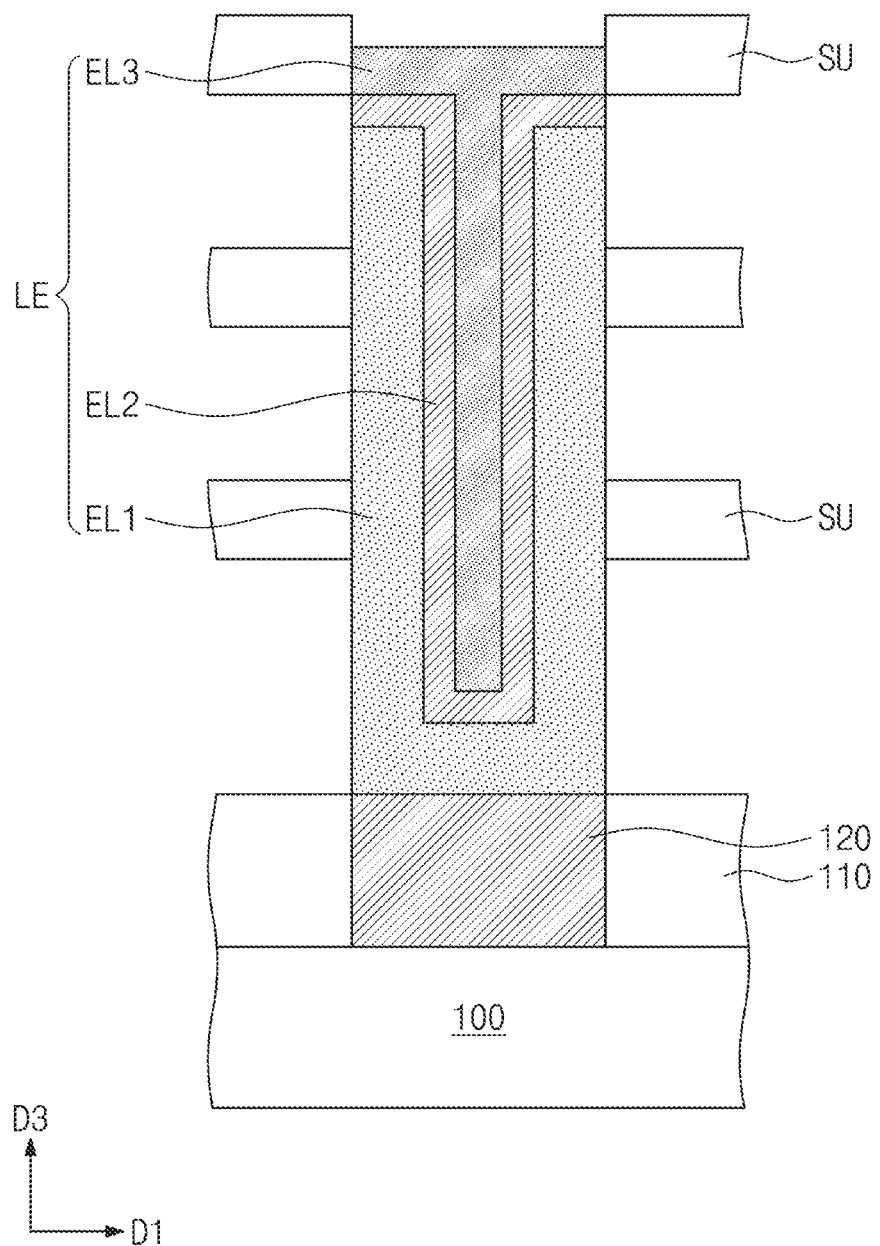

Referring to FIG. 2G, the sacrificial layers 140 may be selectively removed. Since the sacrificial layers 140 are removed, side surfaces of the first and second electrode layers EL1 and EL2 may be exposed.

Figure 2H:
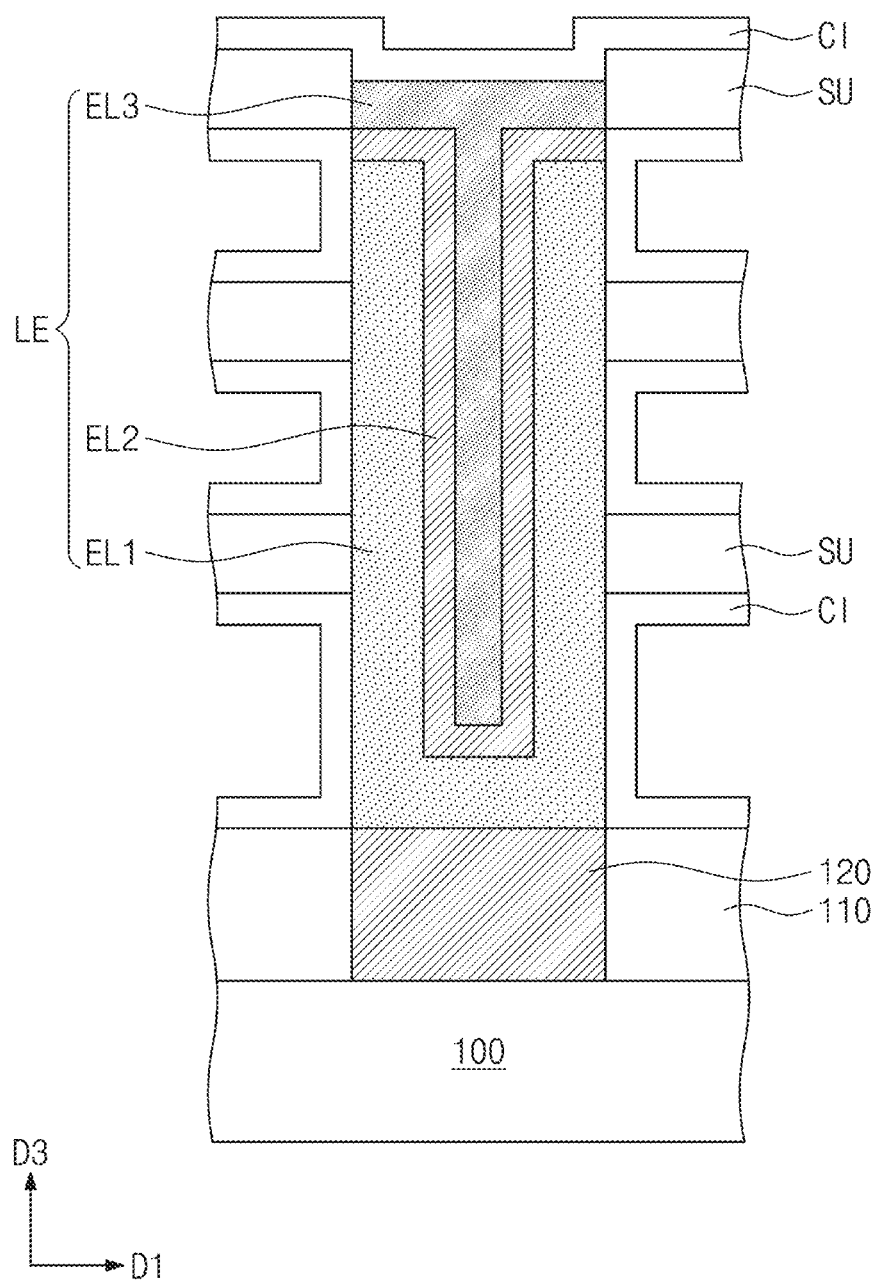

Referring to FIG. 2H, the capacitor insulating layer CI may be formed. The capacitor insulating layer CI may cover the lower electrode LE and the supporters SU. The capacitor insulating layer CI may be formed to cover exposed side surfaces of the first and second electrode layers EL1 and EL2. In an example embodiment, the capacitor insulating layer CI may cover a top surface of the third electrode layer EL3.

Referring to FIG. 1B, the upper electrode UE may be formed to cover the lower electrode LE, the supporters SU, and the capacitor insulating layer CI.

In the fabrication method according to an example embodiment of the inventive concept, a group 14 element may be injected into the first preliminary electrode layer pEL1 through exposed surfaces of the first preliminary electrode layer pEL1, and thus, the first electrode layer EL1 may have a non-vanishing concentration gradient of the group 14 element.

In the fabrication method according to an example embodiment of the inventive concepts, the group 14 element may be injected in a manner of replacing a titanium in the first preliminary electrode layer pEL1 with the group 14 element, and thus, it may be possible to suppress deterioration of crystalline characteristics of the first preliminary electrode layer pEL1 caused by the injection of the group 14 element. Accordingly, it may be possible to improve crystalline characteristics of the capacitor insulating layer CI formed on the first electrode layer EL1.

Figure 3B:
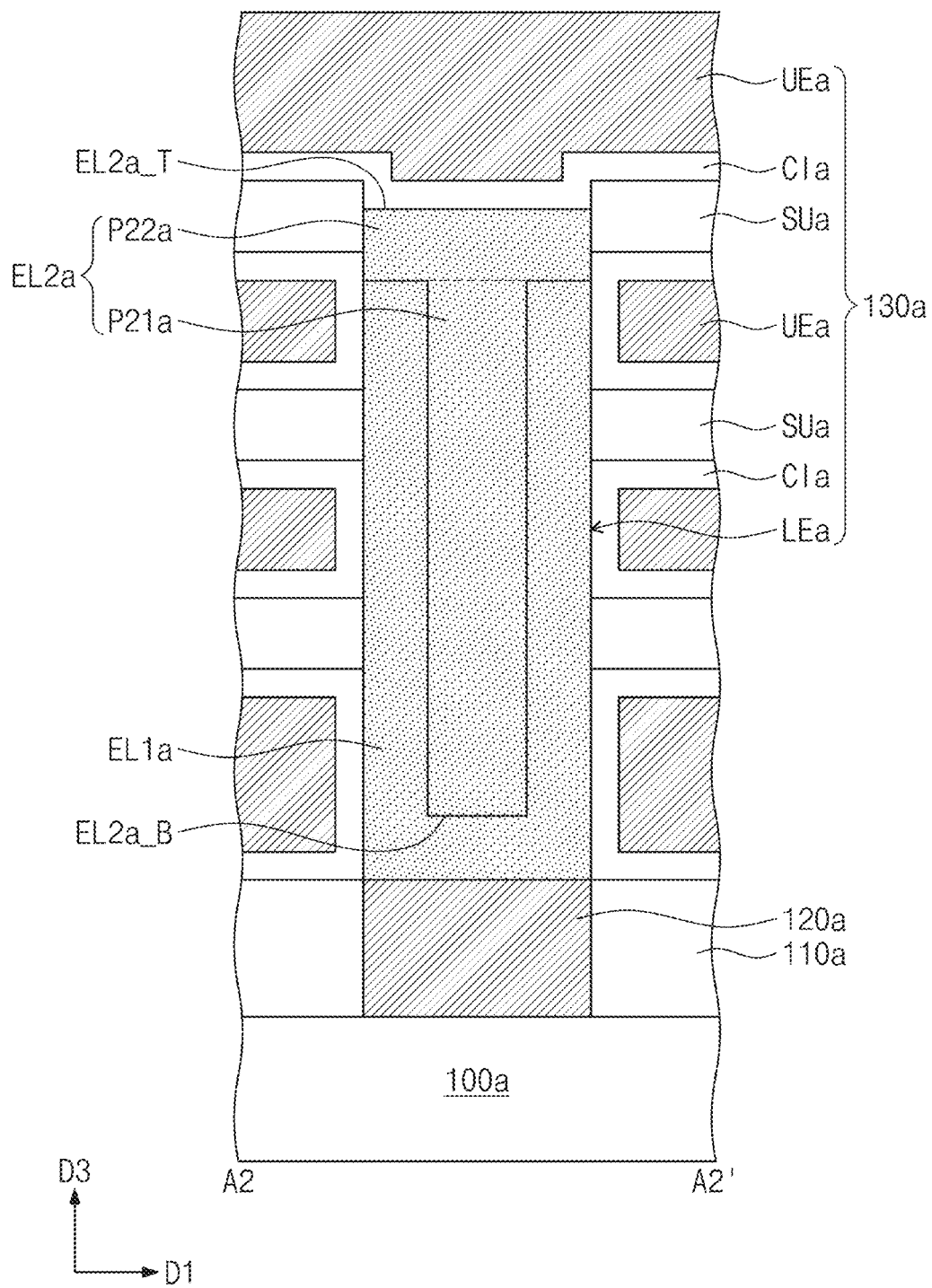
FIG. 3B is a sectional view taken along a line A2-A2' of FIG. 3A.

FIG. 3A is a plan view illustrating a semiconductor device according to an example embodiment of the inventive concepts. FIG. 3B is a sectional view taken along a line A2-A2' of FIG. 3A.

Referring to FIGS. 3A and 3B, a semiconductor device may include a substrate 100a, an interlayer insulating layer 110a, a capacitor contact structure 120a, and a capacitor structure 130a. The capacitor structure 130a may include a lower electrode LEa, supporters SUa, a capacitor insulating layer CIa, and an upper electrode UEa.

The lower electrode LEa may include a first electrode layer EL1a and a second electrode layer EL2a on the first electrode layer EL1a. The second electrode layer EL2a may include a first portion P21a, which is enclosed by the first electrode layer EL1a, and a second portion P22a on the first portion P21a. The first portion P21a of the second electrode layer EL2a may have a shape of a circular pillar extending in the third direction D3. The second portion P22a of the second electrode layer EL2a may be disposed at a level higher than the first electrode layer EL1a. The second portion P22a of the second electrode layer EL2a may have a shape of a circular plate, which is extended in the first and second directions D1 and D2. A width of the second portion P22a of the second electrode layer EL2a may be larger than a width of the first portion P21a of the second electrode layer EL2a.

The first electrode layer EL1a may be formed of or include a conductive material containing a group 14 element. The concentration of the group 14 element in the first electrode layer EL1a may increase as a distance to the second electrode layer EL2a decreases.

The second electrode layer EL2a may contain the same or substantially the same elements as the first electrode layer EL1a. The second electrode layer EL2a may be formed of or include a conductive material containing a group 14 element. As an example, the group 14 element in the first and second electrode layers EL1a and EL2a may be silicon or carbon.

The concentration of the group 14 element in the second electrode layer EL2a may increase as a distance to a top surface EL2a_T of the second electrode layer EL2a decreases. The top surface EL2a_T of the second electrode layer EL2a may be a top surface of the second portion P22a of the second electrode layer EL2a. The concentration of the group 14 element in the second portion P22a of the second electrode layer EL2a may be higher than the concentration of the group 14 element in the first portion P21a of the second electrode layer EL2a. The concentration of the group 14 element in the second electrode layer EL2a may increase in a direction from the bottom surface EL2a_B toward the top surface EL2a_T. The concentration of the group 14 element in the top surface EL2a_T of the second electrode layer EL2a may be higher than the concentration of the group 14 element in the bottom surface EL2a_B of the second electrode layer EL2a.

In an example embodiment, each of the first and second electrode layers EL1a and EL2a may be a crystalline layer. As an example, each of the first and second electrode layers EL1a and EL2a may be a crystalline TiSiN layer.

Figure 4A:
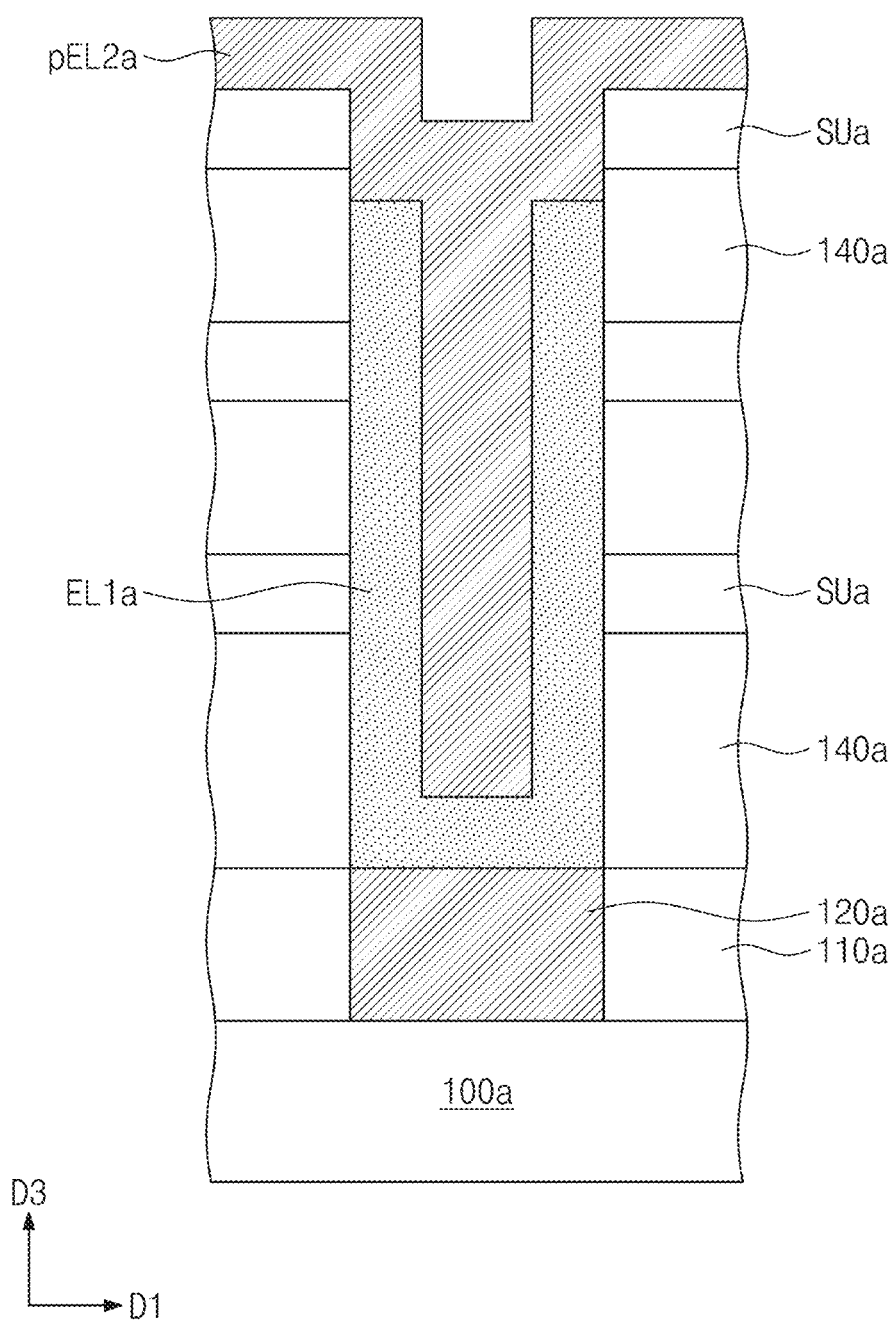
FIGS. 4A, 4B, and 4C are sectional views illustrating a method of fabricating the semiconductor device of FIGS. 3A and 3B.
Figure 4B:
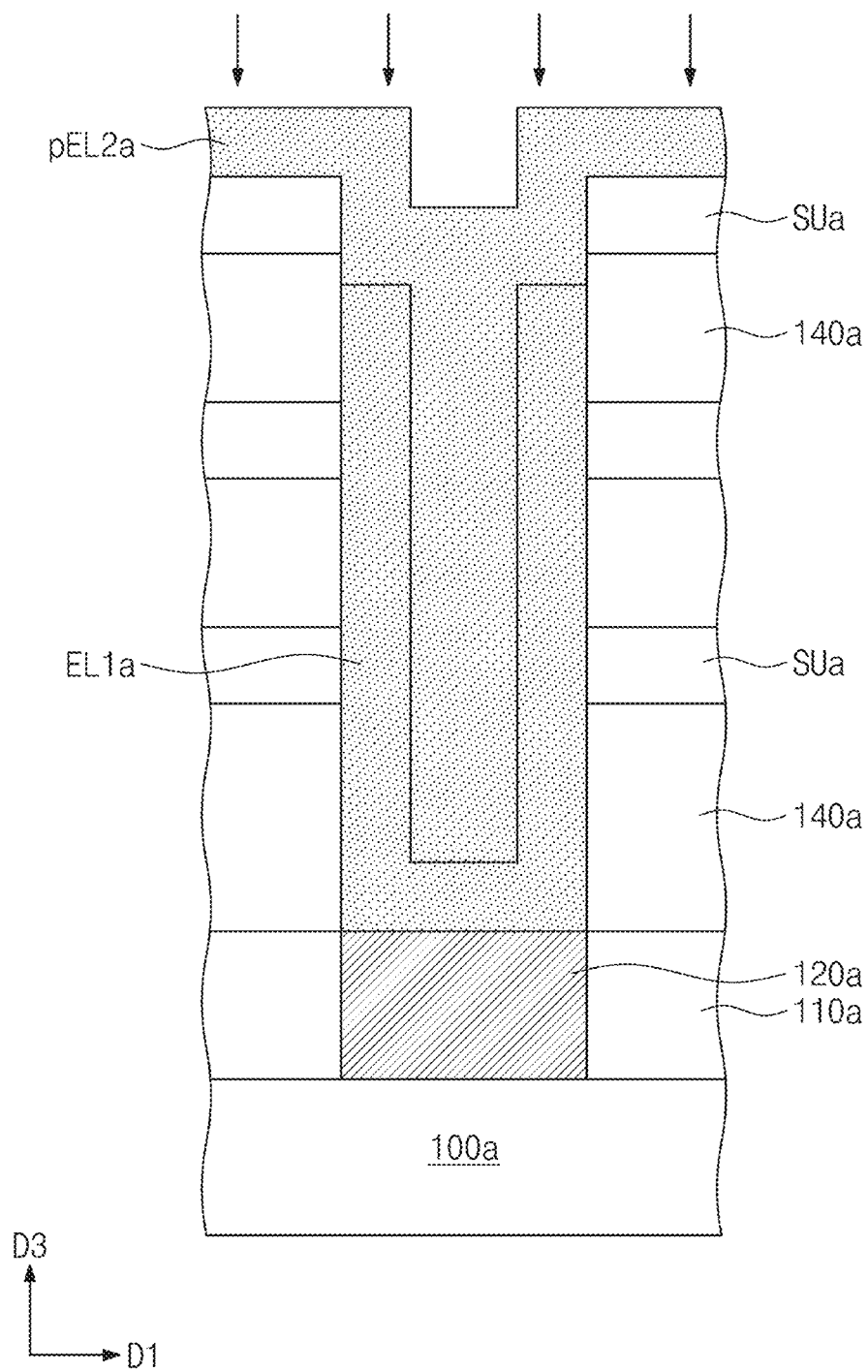
Figure 4C:
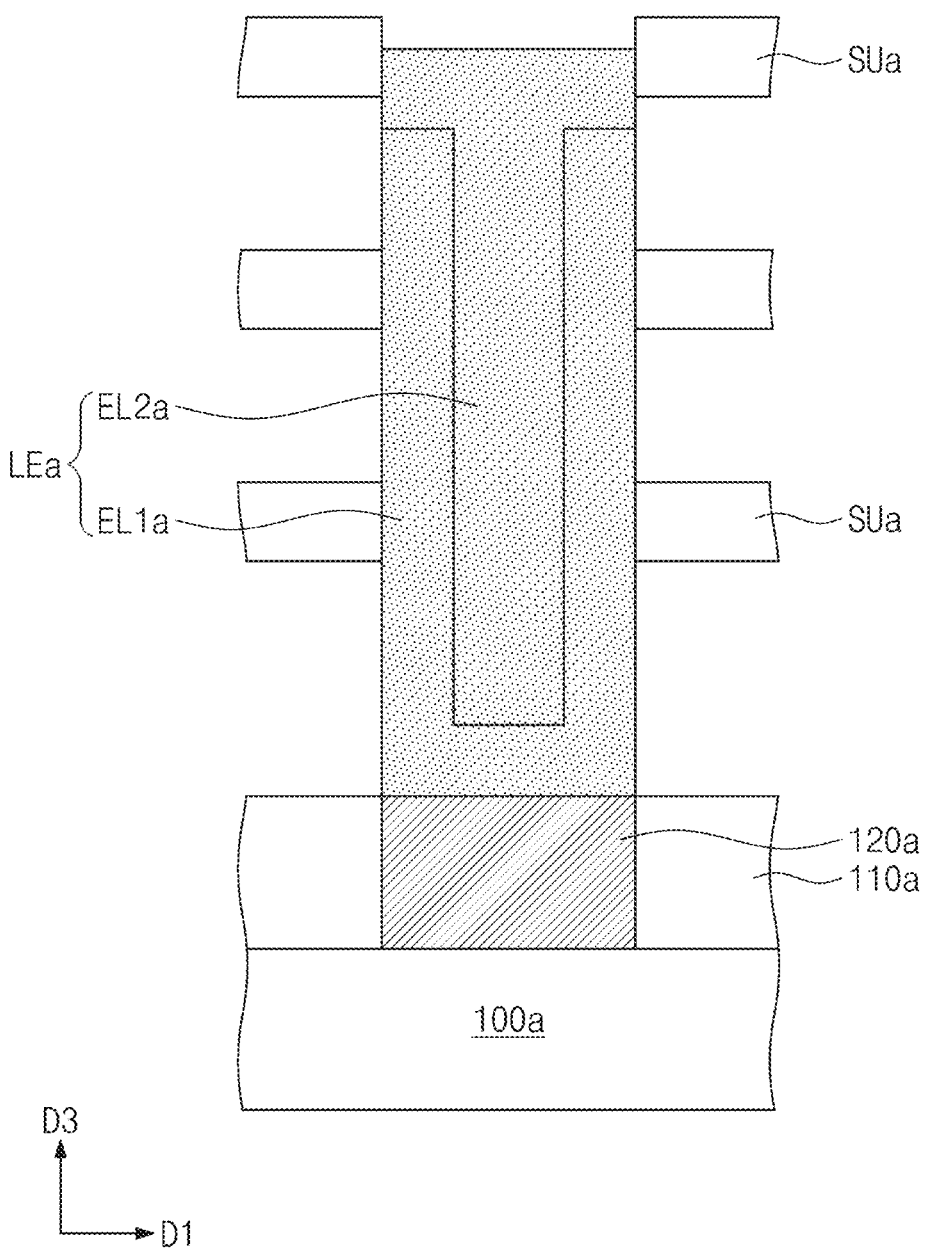

FIGS. 4A, 4B, and 4C are sectional views illustrating a method of fabricating the semiconductor device of FIGS. 3A and 3B.

Referring to FIG. 4A, similar to the example embodiment described with reference to FIG. 2A to 2D, the interlayer insulating layer 110a and the capacitor contact structure 120a may be formed on the substrate 100a, and then, sacrificial layers 140a, the supporters SUa, and the first electrode layer EL1a may be formed on the interlayer insulating layer 110a and the capacitor contact structure 120a.

A second preliminary electrode layer pEL2a may be formed. The second preliminary electrode layer pEL2a may cover the first electrode layer EL1a, the supporters SUa, and the sacrificial layers 140a. The second preliminary electrode layer pEL2a may be formed of or include a conductive material. As an example, the second preliminary electrode layer pEL2a may be formed of or include TiN. In an example embodiment, the second preliminary electrode layer pEL2a may be a crystalline layer. As an example, the second preliminary electrode layer pEL2a may be a crystalline TiN layer.

Referring to FIG. 4B, a group 14 element may be injected into the second preliminary electrode layer pEL2a. In an example embodiment, the second preliminary electrode layer pEL2a, in which the group 14 element is injected, may be a crystalline layer. As an example, the second preliminary electrode layer pEL2a, in which the group 14 element is injected, may be a crystalline TiSiN layer. The concentration of the group 14 element in the second preliminary electrode layer pEL2a may not be uniform. The group 14 element may be injected into the second preliminary electrode layer pEL2a through exposed surfaces of the second preliminary electrode layer pEL2a, and the concentration of the group 14 element may increase as a distance to the exposed surfaces of the second preliminary electrode layer pEL2a decreases. In an example embodiment, the group 14 element may be injected into the second preliminary electrode layer pEL2a in a manner of replacing a titanium in the second preliminary electrode layer pEL2a with the group 14 element.

Referring to FIG. 4C, the second electrode layer EL2a may be formed by removing an upper portion of the second preliminary electrode layer pEL2a. In an example embodiment, the second preliminary electrode layer pEL2a may be divided into a plurality of second electrode layers EL2a. As a result of the formation of the second electrode layer EL2a, the lower electrode LEa including the first and second electrode layers EL1a and EL2a may be formed. The sacrificial layers 140a may be removed.

Referring to FIG. 3B, the capacitor insulating layer CIa may be formed to cover the supporters SUa and the lower electrode LEa, and then, the upper electrode UEa may be formed to cover the capacitor insulating layer CIa.

Figure 5:
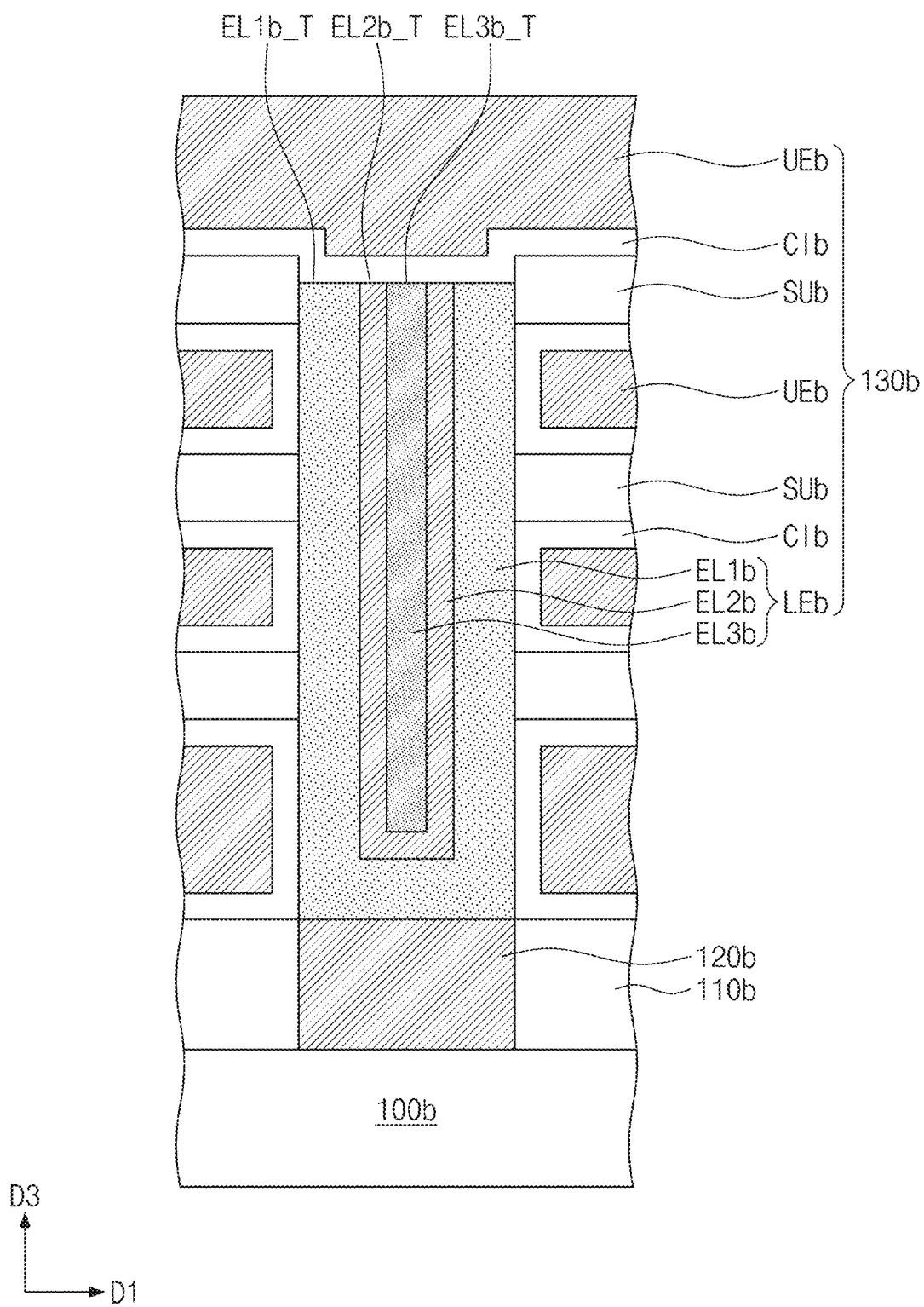
FIG. 5 is a sectional view illustrating a semiconductor device according to an example embodiment of the inventive concepts.

FIG. 5 is a sectional view illustrating a semiconductor device according to an example embodiment of the inventive concepts.

Referring to FIG. 5, a semiconductor device may include a substrate 100b, an interlayer insulating layer 110b, a capacitor contact structure 120b, and a capacitor structure 130b. The capacitor structure 130b may include a lower electrode LEb, supporters SUb, a capacitor insulating layer CIb, and an upper electrode UEb.

The lower electrode LEb may include a first electrode layer EL1b, a second electrode layer EL2b on the first electrode layer EL1b, and a third electrode layer EL3b on the second electrode layer EL2b. The first electrode layer EL1b may be provided to enclose the second electrode layer EL2b. The second electrode layer EL2b may be provided in the first electrode layer EL1b. The second electrode layer EL2b may be provided to enclose the third electrode layer EL3b. The third electrode layer EL3b may be provided in the second electrode layer EL2b.

A top surface EL1b_T of the first electrode layer EL1b, a top surface EL2b_T of the second electrode layer EL2b, and a top surface EL3b_T of the third electrode layer EL3b may be coplanar or substantially coplanar with each other. The top surface EL1b_T of the first electrode layer EL1b, the top surface EL2b_T of the second electrode layer EL2b, and the top surface EL3b_T of the third electrode layer EL3b may be disposed at the same level. The top surface EL1b_T of the first electrode layer EL1b, the top surface EL2b_T of the second electrode layer EL2b, and the top surface EL3b_T of the third electrode layer EL3b may be in contact with the capacitor insulating layer CIb.

The first electrode layer EL1b may be formed of or include a conductive material containing a group 14 element. The concentration of the group 14 element in the first electrode layer EL1b may increase as a distance to the second electrode layer EL2b decreases. The second electrode layer EL2b may be formed of or include a conductive material, in which a group 14 element is not contained. The third electrode layer EL3b may contain the same elements as the first electrode layer EL1b. The third electrode layer EL3b may be formed of or include a conductive material containing a group 14 element. A mean size of grains in the first electrode layer EL1b and a mean size of grains in the second electrode layer EL2b may be larger than a mean size of grains in the third electrode layer EL3b. In an example embodiment, each of the first and second electrode layers EL1b and EL2b may be a crystalline layer, and the third electrode layer EL3b may be an amorphous layer.

Figure 6:
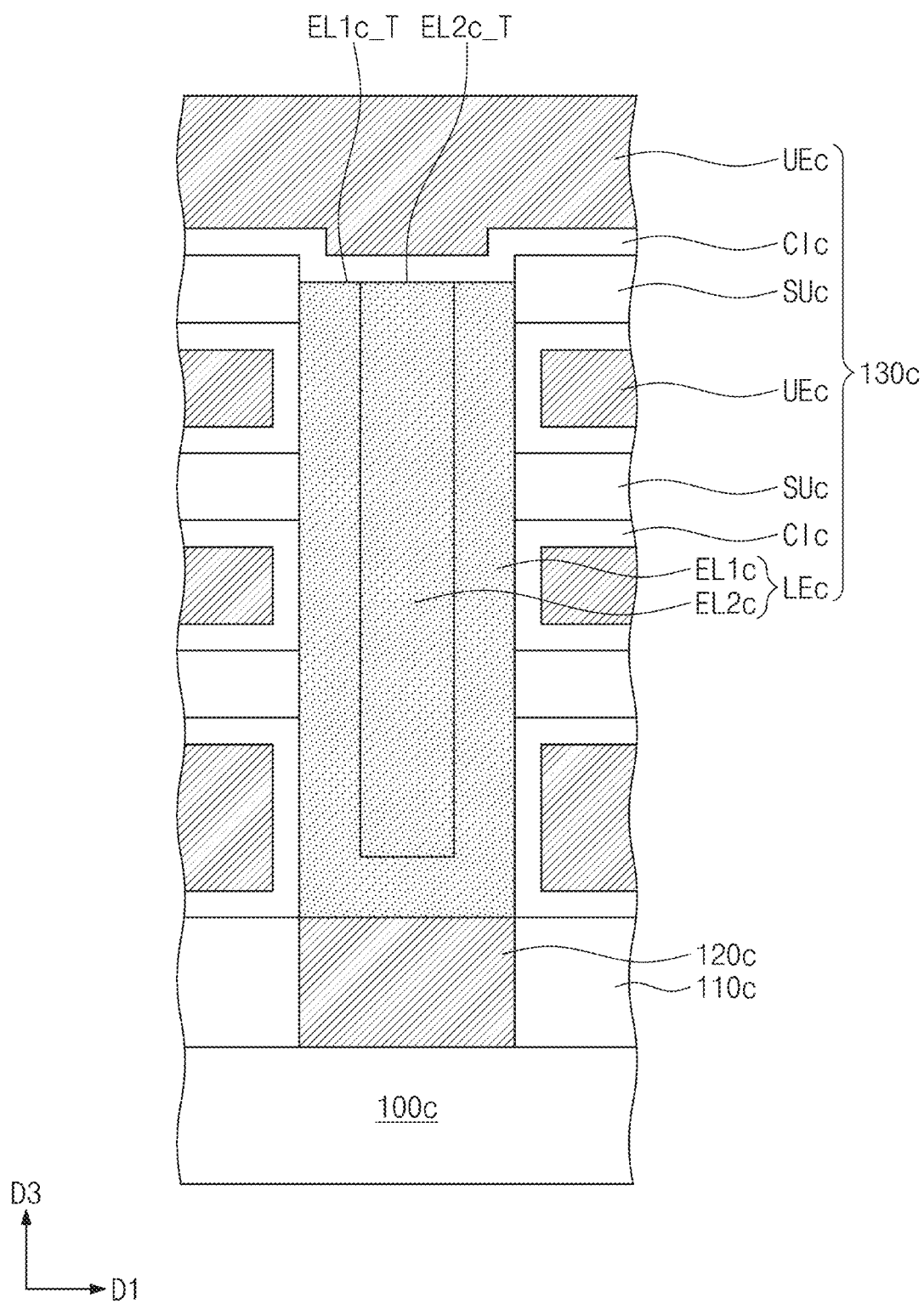
FIG. 6 is a sectional view illustrating a semiconductor device according to an example embodiment of the inventive concepts.

FIG. 6 is a sectional view illustrating a semiconductor device according to an example embodiment of the inventive concepts.

Referring to FIG. 6, a semiconductor device may include a substrate 100c, an interlayer insulating layer 110c, a capacitor contact structure 120c, and a capacitor structure 130c. The capacitor structure 130c may include a lower electrode LEc, supporters SUc, a capacitor insulating layer CIc, and an upper electrode UEc.

The lower electrode LEc may include a first electrode layer EL1c and a second electrode layer EL2c on the first electrode layer EL1c. The first electrode layer EL1c may be provided to enclose the second electrode layer EL2c. The second electrode layer EL2c may be provided in the first electrode layer EL1c.

A top surface EL1c_T of the first electrode layer EL1c and a top surface EL2c_T of the second electrode layer EL2c may be coplanar or substantially coplanar with each other. The top surface EL1c_T of the first electrode layer EL1c and the top surface EL2c_T of the second electrode layer EL2c may be disposed at the same level. The top surface EL1c_T of the first electrode layer EL1c and the top surface EL2c_T of the second electrode layer EL2c may be in contact with the capacitor insulating layer CI.

The first electrode layer EL1c may be formed of or include a conductive material containing a group 14 element. The concentration of the group 14 element in the first electrode layer EL1c may increase as a distance to the second electrode layer EL2c decreases. The second electrode layer EL2c may contain the same or substantially the same elements as the first electrode layer EL1c. The second electrode layer EL2c may be formed of or include a conductive material containing a group 14 element. The concentration of the group 14 element in the second electrode layer EL2c may increase as a distance to the top surface EL2c_T of the second electrode layer EL2c decreases. In an example embodiment, each of the first and second electrode layers EL1c and EL2c may be a crystalline layer.

Figure 7:
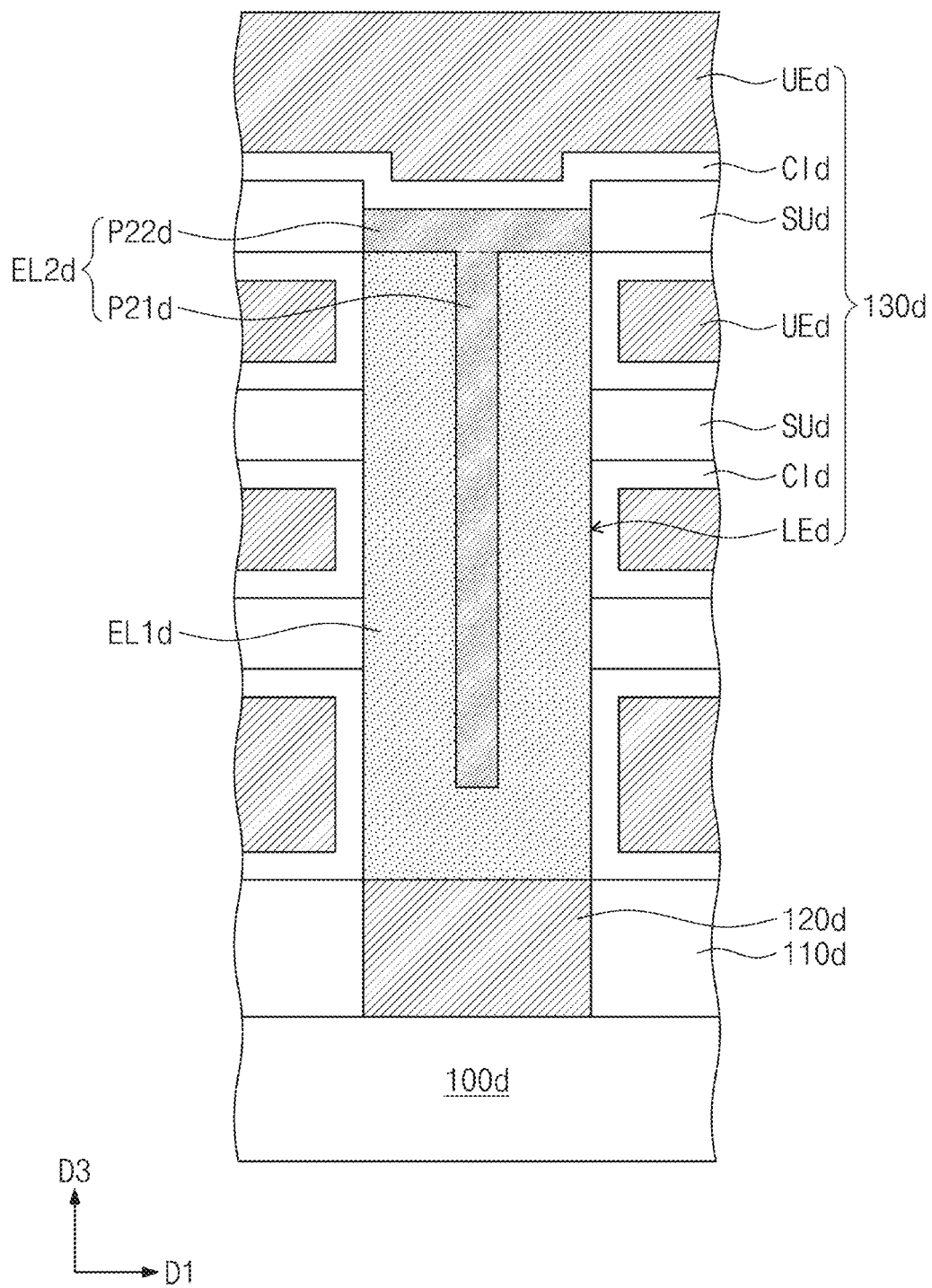
FIG. 7 is a sectional view illustrating a semiconductor device according to an example embodiment of the inventive concepts.

FIG. 7 is a sectional view illustrating a semiconductor device according to an example embodiment of the inventive concepts.

Referring to FIG. 7, a semiconductor device may include a substrate 100d, an interlayer insulating layer 110d, a capacitor contact structure 120d, and a capacitor structure 130d. The capacitor structure 130d may include a lower electrode LEd, supporters SUd, a capacitor insulating layer CId, and an upper electrode UEd.

The lower electrode LEd may include a first electrode layer EL1d and a second electrode layer EL2d on the first electrode layer EL1d. The second electrode layer EL2d may include a first portion P21d, which is provided in the first electrode layer EL1d, and a second portion P22d, which is provided on the first portion P21d. The second portion P22d of the second electrode layer EL2d may be disposed at a level higher than the first electrode layer EL1d. The first portion P21d of the second electrode layer EL2d may have a shape of a circular pillar extending in the third direction D3. The second portion P22d of the second electrode layer EL2d may have a shape of a circular plate, which is extended in the first and second directions D1 and D2. A width of the second portion P22d of the second electrode layer EL2d may be larger than a width of the first portion P21d of the second electrode layer EL2d.

The first electrode layer EL1d may be formed of or include a conductive material containing a group 14 element. The concentration of the group 14 element in the first electrode layer EL1d may increase as a distance to the second electrode layer EL2d decreases. The second electrode layer EL2d may contain the same elements as the first electrode layer EL1d. The second electrode layer EL2d may be formed of or include a conductive material containing a group 14 element.

A mean size of grains in the first electrode layer EL1d may be larger than a mean size of grains in the second electrode layer EL2d. In an example embodiment, the first electrode layer EL1d may be a crystalline layer, and the second electrode layer EL2d may be an amorphous layer. As an example, the first electrode layer EL1d may be a crystalline TiSiN layer, and the second electrode layer EL2d may be an amorphous TiSiN layer.

Figure 8A:
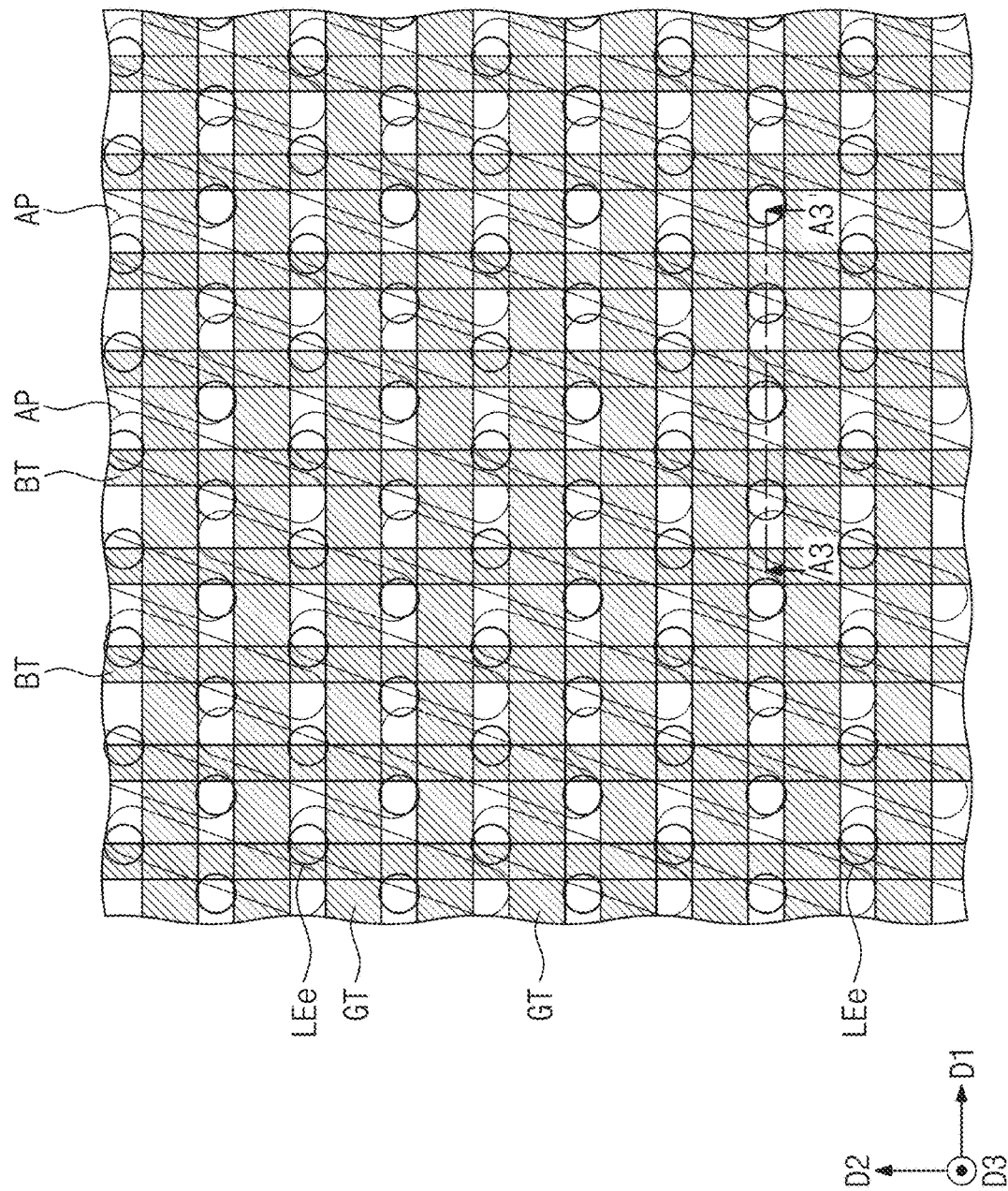
FIG. 8A is a plan view illustrating a semiconductor device according to an example embodiment of the inventive concepts.
Figure 8B:
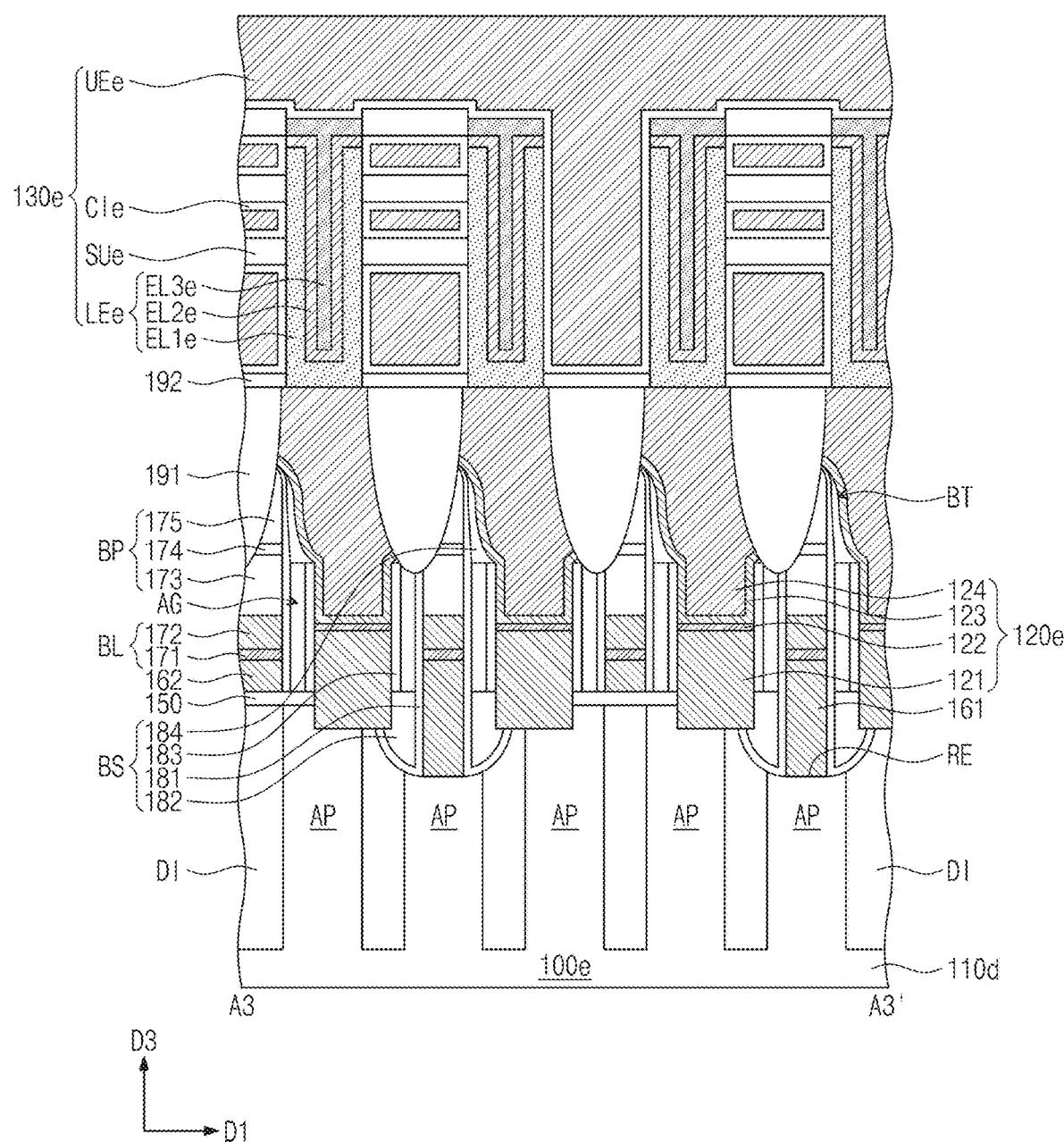
FIG. 8B is a sectional view taken along a line A3-A3' of FIG. 8A.

FIG. 8A is a plan view illustrating a semiconductor device according to an example embodiment of the inventive concepts. FIG. 8B is a sectional view taken along a line A3-A3' of FIG. 8A.

Referring to FIGS. 8A and 8B, a semiconductor device may include a substrate 100e.

The substrate 100e may include active patterns AP. Upper portions of the substrate 100e protruding in the third direction D3 may be defined as the active patterns AP. The active patterns AP may be spaced apart from each other.

A device isolation layer DI may be provided in a space between the active patterns AP. The active patterns AP may be defined by the device isolation layer DI. Each of the active pattern's AP may be enclosed by the device isolation layer DI. The device isolation layer DI may be formed of or include an insulating material. In an example embodiment, the device isolation layer DI may be formed of or include oxide.

Gate structures GT may be provided to extend in the first direction D1. The gate structures GT may be spaced apart from each other in the second direction D2. The gate structure GT may be provided on the device isolation layer DI and the active patterns AP. The gate structure GT may be a buried gate structure, which is buried in the active patterns AP and the device isolation layer DI. The active patterns AP may include impurity regions. A cell transistor may be defined by the gate structure GT and the active pattern AP.

An insulating pattern 150 may be provided on the substrate 100e. In an example embodiment, the insulating pattern 150 may be a multi-layered insulating layer. Recesses RE may be defined by the active pattern AP of the substrate 100e, the device isolation layer DI, and the insulating pattern 150.

Bit line structures BT may be provided to extend in the second direction D2. The bit line structures BT may be spaced apart from each other in the first direction D1. The bit line structure BT may be provided on the insulating pattern 150 and the active pattern AP. The bit line structure BT may be electrically connected to the active pattern AP.

Each of the bit line structures BT may include a bit line BL, a bit line capping layer BP, bit line spacers BS, bit line contacts 161, and poly silicon patterns 162.

Each of the bit line contacts 161 may be provided in each of the recesses RE. The bit line contact 161 may be connected to the active pattern AP through the recess RE. The poly silicon patterns 162 may be provided on the insulating pattern 150. The bit line contacts 161 and the poly silicon patterns 162 of the bit line structure BT may be alternately disposed in the second direction D2.

The bit line BL may be provided on the bit line contacts 161 and the poly silicon patterns 162. The bit line BL may include a first line pattern 171 and a second line pattern 172 on the first line pattern 171. The first line pattern 171 and the second line pattern 172 may be extended in the second direction D2. The first and second line patterns 171 and 172 may be formed of or include a conductive material. As an example, the first line pattern 171 may be formed of or include metal silicide, and the second line pattern 172 may be formed of or include tungsten.

The bit line capping layer BP may be provided on the bit line BL. The bit line capping layer BP may include a first capping pattern 173, a second capping pattern 174 on the first capping pattern 173, and a third capping pattern 175 on the second capping pattern 174. The first to third capping patterns 173, 174, and 175 may be formed of or include an insulating material.

The bit line spacers BS may be provided at both sides of the bit line capping layer BP, the bit line BL, the bit line contacts 161, and the poly silicon patterns 162. Each of the bit line spacers BS may include a first spacer pattern 181, a second spacer pattern 182, a third spacer pattern 183, and a fourth spacer pattern 184.

The first spacer pattern 181 may cover side surfaces of the bit line capping layer BP, the bit line BL, the bit line contacts 161, and the poly silicon patterns 162. The first spacer pattern 181 may be provided to cover surfaces of the active pattern AP and the device isolation layer DI defining the recess RE. The second spacer pattern 182 may be provided on the first spacer pattern 181 to fill the recess RE. The third spacer pattern 183 may be provided on the second spacer pattern 182. The third spacer pattern 183 may be spaced apart from the first spacer pattern 181 in the first direction D1. An air gap AG may be provided between the first and third spacer patterns 181 and 183. The fourth spacer pattern 184 may be provided on the first and third spacer patterns 181 and 183. The fourth spacer pattern 184 may cover the air gap AG. The first to fourth spacer patterns 181, 182, 183, and 184 may be formed of or include an insulating material.

Capacitor contact structures 120e, which are connected to the active patterns AP of the substrate 100e, may be provided. Each of the capacitor contact structures 120e may include a buried contact 121, an ohmic pattern 122, a barrier layer 123, and a landing pad 124.

The buried contact 121 may be connected to the active pattern AP. The buried contact 121 may be provided between the bit line spacers BS. The ohmic pattern 122 may be provided on the buried contact 121. The barrier layer 123 may cover the ohmic pattern 122 and the bit line spacer BS. The landing pad 124 may be provided on the barrier layer 123. The buried contact 121, the ohmic pattern 122, the barrier layer 123, and the landing pad 124 may be formed of or include a conductive material. In an example embodiment, the buried contact 121 may be formed of or include poly silicon, the ohmic pattern 122 may be formed of or include at least one of metal silicide materials, the barrier layer 123 may be formed of or include at least one of titanium nitride or tantalum nitride, and the landing pad 124 may be formed of or include tungsten, but example embodiments are not limited thereto.

A filling pattern 191 may be provided on the bit line structure BT. The filling pattern 191 may separate the landing pads 124 from each other. An etch stop layer 192 may be provided on the filling pattern 191. The filling pattern 191 and the etch stop layer 192 may be formed of or include an insulating material.

A capacitor structure 130e may be provided on the etch stop layer 192 and the capacitor contact structure 120e. The capacitor structure 130e may include lower electrodes LEe, a capacitor insulating layer CIe, supporters SUe, and an upper electrode UEe.

The capacitor structure 130e may be connected to the landing pad 124 of the capacitor contact structure 120e. The capacitor structure 130e may be electrically connected to the active pattern AP through the landing pad 124, the barrier layer 123, the ohmic pattern 122, and the buried contact 121 of the capacitor contact structure 120e.

The lower electrode LEe may be connected to the landing pad 124. The lower electrode LEe may include a first electrode layer EL1e, a second electrode layer EL2e on the first electrode layer EL1e, and a third electrode layer EL3e on the second electrode layer EL2e. The first electrode layer EL1e may be formed of or include a conductive material containing a group 14 element. The concentration of the group 14 element in the first electrode layer EL1e may increase as a distance to the second electrode layer EL2e decreases. The second electrode layer EL2e may be formed of or include a conductive material, in which a group 14 element is not contained. The third electrode layer EL3e may contain the same or substantially the same elements as the first electrode layer EL1e. The third electrode layer EL3e may be formed of or include a conductive material containing a group 14 element. In an example embodiment, each of the first and second electrode layers EL1e and EL2e may be a crystalline layer, and the third electrode layer EL3e may be an amorphous layer.

Figure 9A:
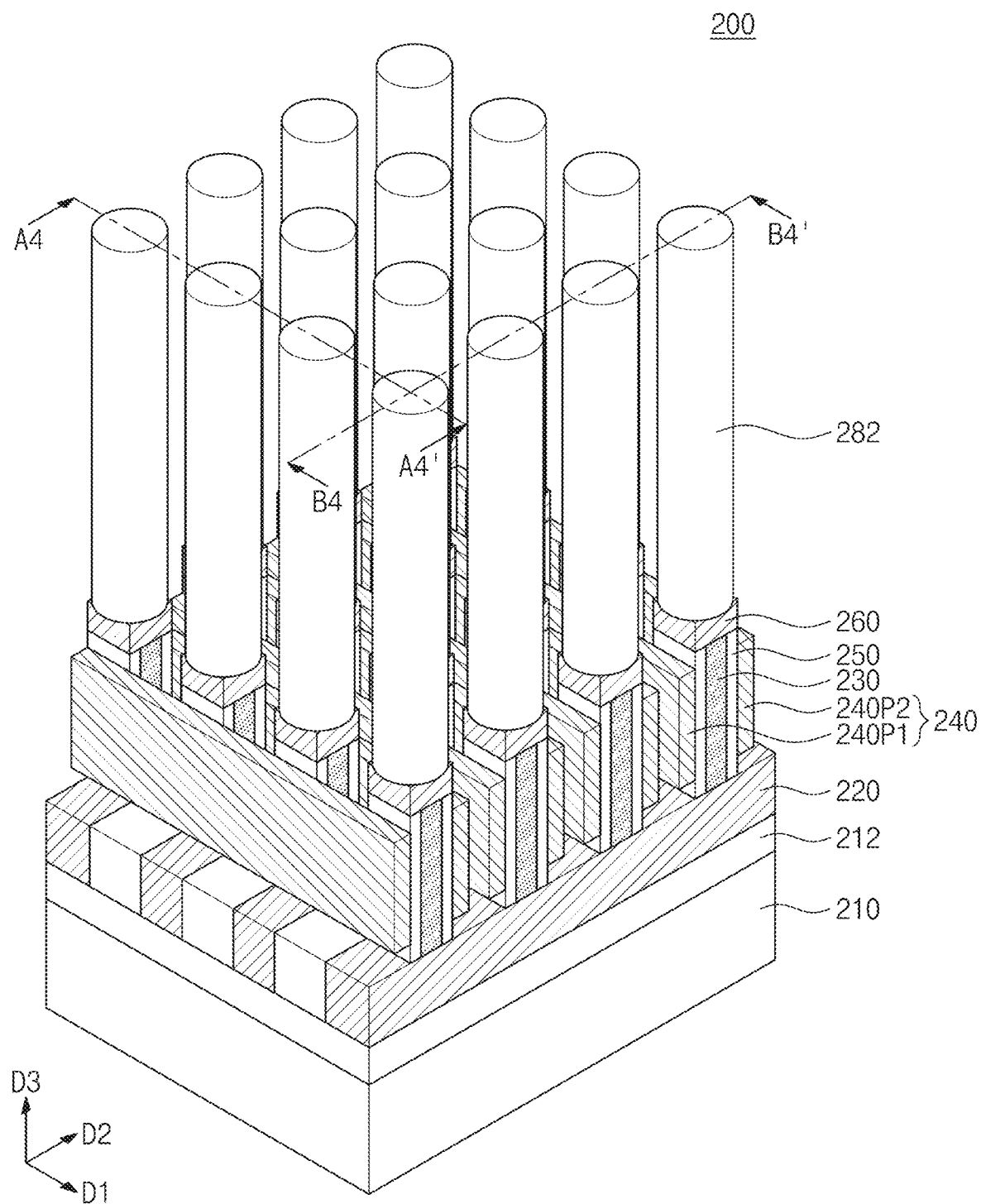
FIG. 9A is a perspective view illustrating a semiconductor device according to an example embodiment of the inventive concepts.
Figure 9B:
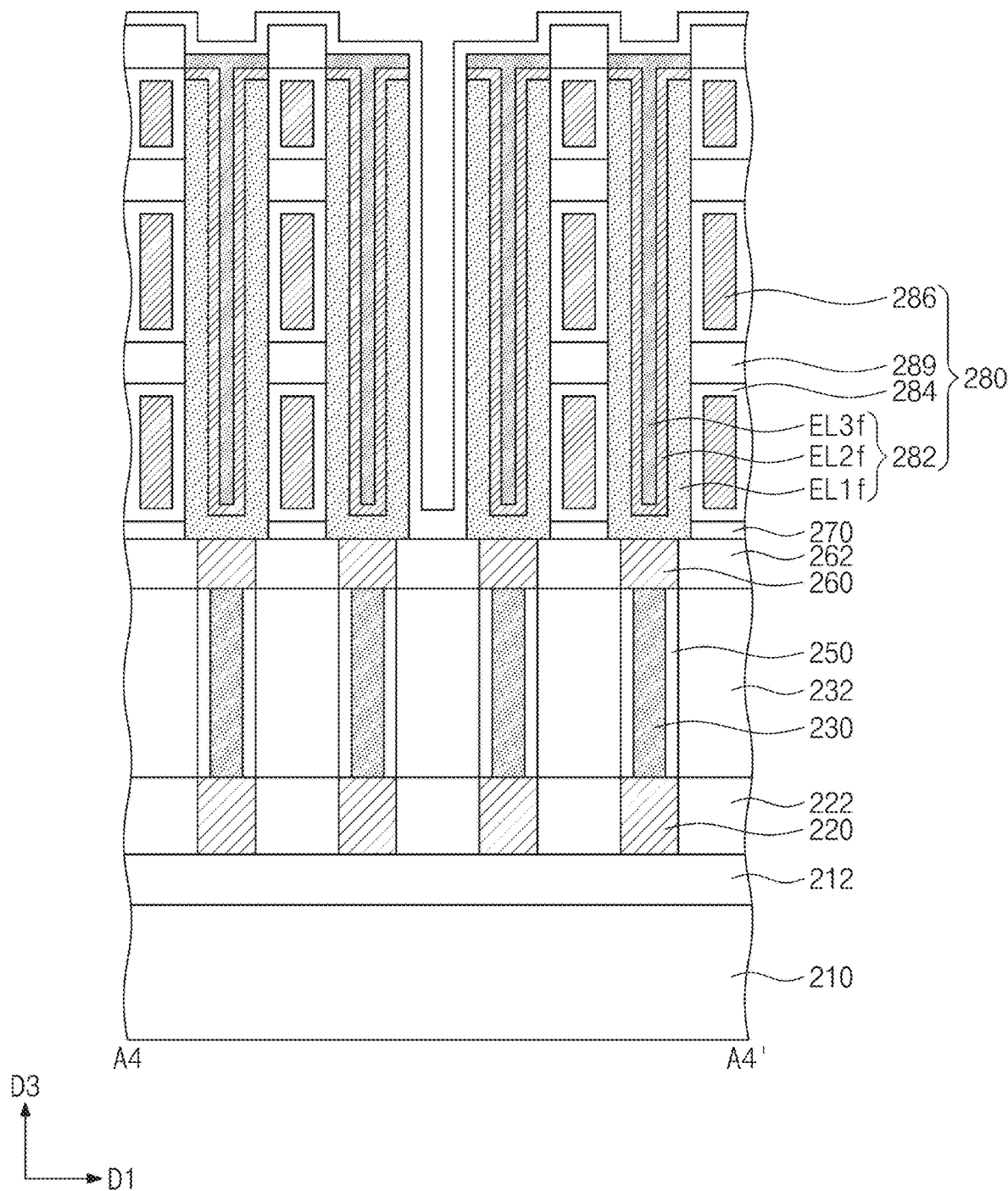
FIG. 9B is a sectional view taken along a line A4-A4' of FIG. 9A.
Figure 9C:
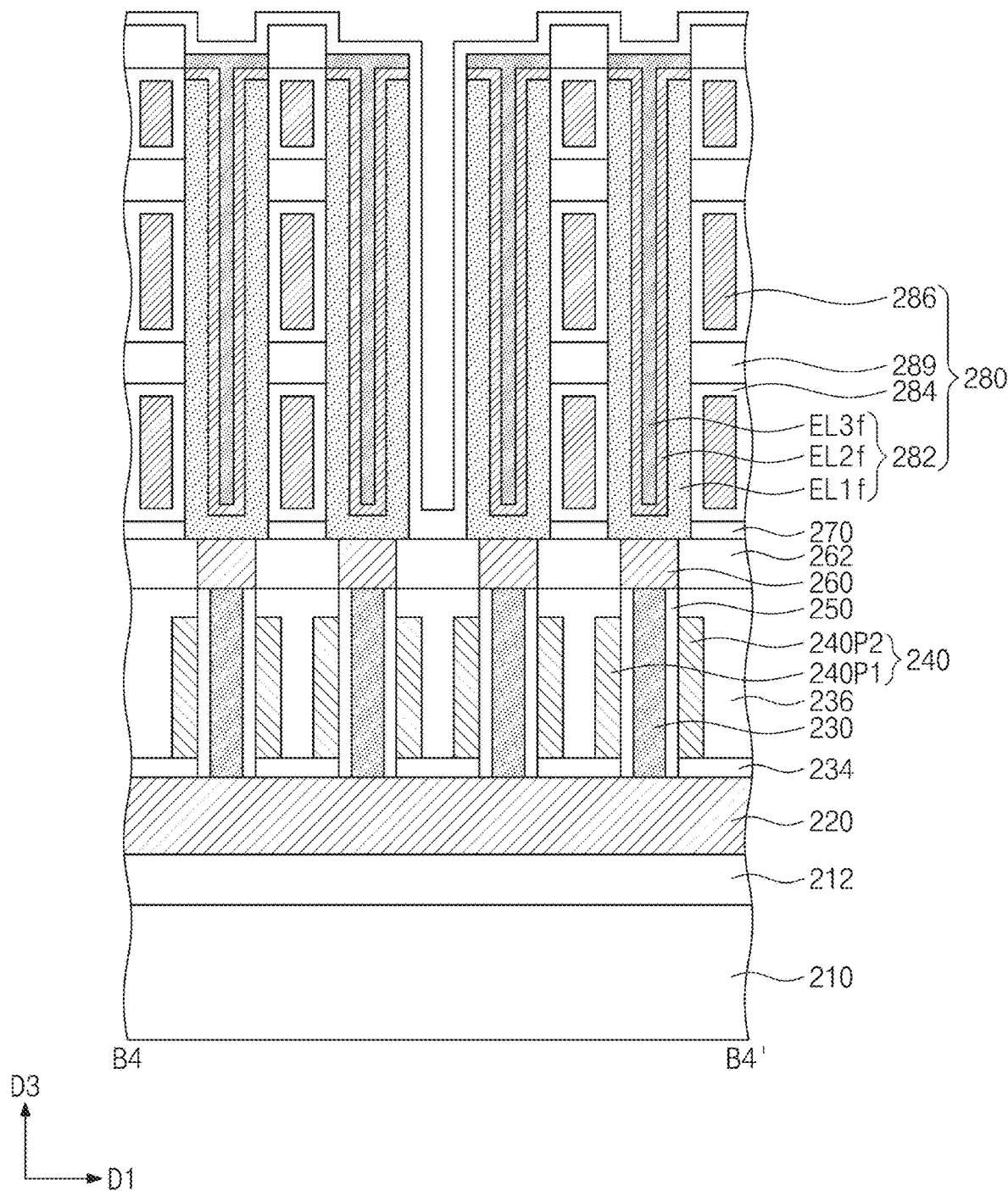
FIG. 9C is a sectional view taken along a line B4-B4' of FIG. 9A.

FIG. 9A is a perspective view illustrating a semiconductor device according to an example embodiment of the inventive concepts. FIG. 9B is a sectional view taken along a line A4-A4' of FIG. 9A. FIG. 9C is a sectional view taken along a line B4-B4' of FIG. 9A.

Referring to FIGS. 9A, 9B, and 9C, a semiconductor device 200 may include a substrate 210, a plurality of first conductive lines 220, a channel layer 230, a gate electrode 240, a gate insulating layer 250, and a capacitor structure 280. The semiconductor device 200 may be a memory device including a vertical channel transistor (VCT). The vertical channel transistor may mean a transistor structure, in which the channel layer 230 is extended from the substrate 210 in a vertical direction or a channel length is defined in the vertical direction.

A lower insulating layer 212 may be disposed on the substrate 210, and the first conductive lines 220 may be disposed on the lower insulating layer 212 such that they are spaced apart from each other in the first direction D1 and are extended in the second direction D2. A plurality of first insulating structures 222 may be disposed on the lower insulating layer 212 to fill spaces between the first conductive lines 220. The first insulating structures 222 may be extended in the second direction D2 and may have top surfaces that are located at the same level as top surfaces of the first conductive lines 220. The first conductive lines 220 may serve as bit lines of the semiconductor device 200.

In an example embodiment, the first conductive lines 220 may be formed of or include at least one of doped polysilicon, metallic materials, conductive metal nitride materials, conductive metal silicide materials, conductive metal oxide materials, or combinations thereof, but example embodiments are not limited thereto. For example, the first conductive lines 220 may be formed of or include at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the inventive concepts are not limited to this example. The first conductive lines 220 may have a single- or multi-layered structure, which is formed of or include the afore-described materials. In an example embodiment, the first conductive lines 220 may be formed of or include at least one of two-dimensional semiconductor materials (e.g., graphene, carbon nanotube, or combinations thereof).

The channel layer 230 may be arranged on the first conductive lines 220 to be spaced apart from each other in the first and second directions D1 and D2 or to form a matrix shape. The channel layer 230 may have a first width in the first direction D1 and a first height in the third direction D3, the first height may be larger than the first width. For example, the first height may be in a range of about 2 to 10 times the first width, but the inventive concepts are not limited to this example. A bottom portion of the channel layer 230 may serve as a first source/drain region (not shown), an upper portion of the channel layer 230 may serve as a second source/drain region (not shown), and a portion of the channel layer 230 between the first and second source/drain regions may serve as a channel region (not shown).

In an embodiment, the channel layer 230 may be formed of or include at least one of oxide semiconductor materials (e.g., InxGayZnzO, InxGaySizO, InxSnyZnzO, InxZnyO, ZnxO, ZnxSnyO, ZnxOyN, ZrxZnySnzO, SnxO, HfxInyZnzO, GaxZnySnzO, AlxZnySnzO, YbxGayZnzO, InxGayO, or combinations thereof), but example embodiments are not limited thereto. The channel layer 230 may include a single- or multi-layered layer formed of at least one of the oxide semiconductor materials. In an example embodiment, the channel layer 230 may have a band gap energy that is greater than a band gap energy of silicon. For example, the channel layer 230 may have a band gap energy in a range of about 1.5 eV to 5.6 eV. In an embodiment, when the channel layer 230 has a band gap energy in a range of about 2.0 eV to 4.0 eV, the channel layer 230 may have an increased or optimized channel performance. In an example embodiment, the channel layer 230 may have a polycrystalline or amorphous structure, but the inventive concepts are not limited to this example. In an example embodiment, the channel layer 230 may be formed of or include at least one of two-dimensional semiconductor materials (e.g., graphene, carbon nanotube, or combinations thereof).

The gate electrode 240 may be provided on opposite side surfaces of the channel layer 230 and may be extended in the first direction D1. The gate electrode 240 may include a first sub-gate electrode 240P1, which is provided to face a first side surface of the channel layer 230, and a second sub-gate electrode 240P2, which is provided to face a second side surface of the channel layer 230 opposite to the first side surface. Since one channel layer 230 is disposed between the first sub-gate electrode 240P1 and the second sub-gate electrode 240P2, the semiconductor device 200 may have a dual gate transistor structure. However, the inventive concepts are not limited to this example, and a semiconductor device according to an example embodiment of the inventive concepts may have a single gate transistor structure, in which only the first sub-gate electrode 240P1, without the second sub-gate electrode 240P2, is provided to face the first side surface of the channel layer 230.

The gate electrode 240 may be formed of or include at least one of doped polysilicon, metallic materials, conductive metal nitride materials, conductive metal silicide materials, conductive metal oxide materials, or combinations thereof, but example embodiments are not limited thereto. For example, the gate electrode 240 may be formed of or include at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the inventive concepts are not limited to this example.

The gate insulating layer 250 may be interposed between the channel layer 230 and the gate electrode 240 and may be provided to enclose the side surface of the channel layer 230. For example, the entire side surface of the channel layer 230 may be surrounded by the gate insulating layer 250, and a portion of a side surface of the gate electrode 240 may be in contact with the gate insulating layer 250. In an example embodiment, the gate insulating layer 250 may be extended in an extension direction of the gate electrode 240, and the channel layer 230 may be provided such that only two side surfaces facing the gate electrode 240 are in contact with the gate insulating layer 250.

In an example embodiment, the gate insulating layer 250 may include at least one of a silicon oxide layer, a silicon oxynitride layer, a high-k dielectric layer having a dielectric constant higher than the silicon oxide layer, or combinations thereof, but example embodiments are not limited thereto. The high-k dielectric layer may be formed of or include at least one of metal oxide materials or metal oxynitride materials. For example, high-k dielectric materials (e.g., $HfO_2$, HfSiO, HfSiON, HfTaO, HfTiO, HfZrO, $ZrO_2$, $Al_2O_3$, or combinations thereof) may be used as the gate insulating layer 250, but the inventive concepts are not limited to this example.

A plurality of second insulating structures 232 may be provided on the first insulating structures 222 to extend in the second direction D2, and the channel layer 230 may be disposed between two adjacent ones of the second insulating structures 232. Furthermore, a first gapfill layer 234 and a second gapfill layer 236 may be disposed in a space, which is defined between two adjacent channel layers 230 and between the two adjacent ones of the second insulating structures 232. The first gapfill layer 234 may be disposed in a bottom portion of the space between the two adjacent channel layers 230, and the second gapfill layer 236 may be disposed on the first gapfill layer 234 to fill a remaining portion of the space between the two adjacent channel layers 230. A top surface of the second gapfill layer 236 may be disposed at the same or substantially the same level as a top surface of the channel layer 230 to cover a top surface of the gate electrode 240. In an example embodiment, the second insulating structures 232 may be formed of a layer that is continuously connected to the first insulating structures 222, and the second gapfill layer 236 may be formed of a layer that is continuously connected to the first gapfill layer 234.

A capacitor contact structure 260 may be disposed on the channel layer 230. The capacitor contact structure 260 may be vertically overlapped with the channel layer 230 and may be spaced apart from each other in the first and second directions D1 and D2 to form a matrix shape. The capacitor contact structure 260 may be formed of or include at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the inventive concepts are not limited to this example. An upper insulating layer 262 may be provided on the second insulating structures 232 and the second gapfill layer 236 to enclose a side surface of the capacitor contact structure 260.

An etch stop layer 270 may be disposed on the upper insulating layer 262, and the capacitor structure 280 may be disposed on the etch stop layer 270. The capacitor structure 280 may include lower electrodes 282, a capacitor insulating layer 284, an upper electrode 286, and supporters 289.

The lower electrode 282 may be provided to penetrate the etch stop layer 270 and may be electrically connected to a top surface of the capacitor contact structure 260. In an example embodiment, the lower electrode 282 may be vertically overlapped with the capacitor contact structure 260 and may be spaced apart from each other in the first and second directions D1 and D2 to form a matrix shape.

The lower electrode 282 may include a first electrode layer EL1f, a second electrode layer EL2f on the first electrode layer EL1f, and a third electrode layer EL3f on the second electrode layer EL2f. The first electrode layer EL if may be formed of or include a conductive material containing a group 14 element. The concentration of the group 14 element in the first electrode layer EL1f may increase as a distance to the second electrode layer EL2f decreases. The second electrode layer EL2f may be formed of or include a conductive material, in which a group 14 element is not contained. The third electrode layer EL3f may contain the same or substantially the same elements as the first electrode layer EL1f. The third electrode layer EL3f may be formed of or include a conductive material containing a group 14 element. In an example embodiment, each of the first and second electrode layers EL1f and EL2f may be a crystalline layer, and the third electrode layer EL3f may be an amorphous layer.

In a semiconductor device according to an example embodiment of the inventive concepts, a lower electrode of a capacitor structure may include an electrode layer containing a group 14 element whose concentration is contained with a non-vanishing gradient. Accordingly, it may be possible to maintain a dielectric property of the capacitor structure and to improve a mechanical strength or hardness of the lower electrode.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

While example embodiments of the inventive concepts have been particularly shown and described, it will be understood by one of ordinary skill in the art that variations in form and detail may be made therein without departing from the scope of the inventive concepts.

What is claimed is:

1. A semiconductor device, comprising:
a substrate;
a capacitor contact structure electrically connected to the substrate;
a lower electrode connected to the capacitor contact structure, wherein the lower electrode includes a first electrode layer and a second electrode layer, the second electrode layer is on the first electrode layer, and the first electrode layer includes a group 14 element;
a capacitor insulating layer covering the lower electrode; and
an upper electrode covering the capacitor insulating layer, wherein
the first electrode layer comprises an outer sidewall in direct contact with the capacitor insulating layer, and the first electrode layer comprises an inner sidewall in direct contact with the second electrode layer, and
a concentration of the group 14 element in the inner sidewall of the first electrode layer is higher than a concentration of the group 14 element in the outer sidewall of the first electrode layer.

2. The semiconductor device of claim 1, wherein the group 14 element has an atomic size smaller than an atomic size of titanium.

3. The semiconductor device of claim 2, wherein the group 14 element is silicon or carbon.

4. The semiconductor device of claim 1, wherein
the second electrode layer comprises a first portion in contact with the inner sidewall of the first electrode layer, and
the second electrode layer comprises a second portion in contact with a top surface of the first electrode layer.

5. The semiconductor device of claim 1, wherein
the second electrode layer comprises the group 14 element, and a concentration of the group 14 element in a top surface of the second electrode layer is higher than a concentration of the group 14 element in a bottom surface of the second electrode layer.

6. The semiconductor device of claim 5, wherein a concentration of the group 14 element in the second electrode layer increases in a direction from the bottom surface of the second electrode layer toward the top surface of the second electrode layer.

7. The semiconductor device of claim 1, wherein
the first electrode layer is a crystalline TiSiN layer, and
the second electrode layer is an amorphous TiSiN layer.

8. The semiconductor device of claim 1, wherein the lower electrode further comprises a third electrode layer on the second electrode layer.

9. The semiconductor device of claim 8, wherein
the first electrode layer is a crystalline TiSiN layer,
the second electrode layer is a crystalline TiN layer, and
the third electrode layer is an amorphous TiSiN layer.

10. The semiconductor device of claim 8, wherein
a mean size of grains in the first electrode layer is larger than a mean size of grains in the third electrode layer, and
a mean size of grains in the second electrode layer is larger than the mean size of grains in the third electrode layer.

11. The semiconductor device of claim 8, wherein a top surface of the first electrode layer, a top surface of the second electrode layer, and a top surface of the third electrode layer are coplanar with each other.

12. The semiconductor device of claim 1, wherein a mean size of grains in the first electrode layer is larger than a mean size of grains in the second electrode layer.

13. The semiconductor device of claim 1, wherein a concentration of the group 14 element in the first electrode layer increases in a direction from the outer sidewall of the first electrode layer toward the inner sidewall of the first electrode layer.

14. A semiconductor device, comprising:
a substrate;
a capacitor contact structure electrically connected to the substrate;
a lower electrode connected to the capacitor contact structure, wherein the lower electrode comprises a first electrode layer and a second electrode layer, the second electrode layer is on the first electrode layer, the first electrode layer encloses at least a portion of the second electrode layer, the first electrode layer includes a group 14 element, and a concentration of the group 14 element in the first electrode layer increases as a distance to the second electrode layer decreases;
a capacitor insulating layer covering the lower electrode; and
an upper electrode covering the capacitor insulating layer.

15. The semiconductor device of claim 14, wherein
the first electrode layer comprises a first portion and a second portion, the second portion on the first portion,
the first portion has a shape of a circular plate, and
the second portion has a shape of a pipe enclosing the at least a portion of the second electrode layer.

16. The semiconductor device of claim 14, wherein
the lower electrode further comprises a third electrode layer, and
the second electrode layer encloses at least a portion of the third electrode layer.

17. The semiconductor device of claim 16, wherein
the first and third electrode layers include a same element, and
the first and third electrode layers have different crystal structures from each other.

18. The semiconductor device of claim 17, wherein
the first electrode layer comprises TiN grain and TiSiN grain, and
the third electrode layer comprises TiN grain, TiSiN grain, and SiN grain.

19. A semiconductor device, comprising:
a substrate including an active pattern;
a capacitor contact structure electrically connected to the active pattern;
a lower electrode connected to the capacitor contact structure, wherein the lower electrode comprises a first electrode layer and a second electrode layer, the first electrode layer is connected to the capacitor contact structure, the second electrode layer is on the first electrode layer, the first electrode layer encloses at least a portion of the second electrode layer, the first electrode layer comprises TiSiN;
a supporter configured to support the lower electrode;
a capacitor insulating layer enclosing the supporter and the lower electrode; and an upper electrode enclosing the capacitor insulating layer, wherein
the first electrode layer comprises an outer sidewall in direct contact with the capacitor insulating layer, an inner sidewall in direct contact with the second electrode layer, and a bottom surface in contact with the capacitor contact structure, and
a concentration of a silicon in the inner sidewall of the first electrode layer is higher than a concentration of a silicon in the outer sidewall of the first electrode layer and a concentration of a silicon in the bottom surface of the first electrode layer.

20. The semiconductor device of claim 19, wherein the outer sidewall of the first electrode layer encloses the inner sidewall of the first electrode layer.

* * * * *